(12) United States Patent
Tang et al.

(10) Patent No.: US 11,046,589 B2
(45) Date of Patent: Jun. 29, 2021

(54) MULTI-ELEMENT PEROVSKITE MATERIAL AS WELL AS PREPARATION AND LUMINESCENT APPLICATION THEREOF

(71) Applicant: HUAZHONG UNIVERSITY OF SCIENCE AND TECHNOLOGY, Hubei (CN)

(72) Inventors: Jiang Tang, Hubei (CN); Shunran Li, Hubei (CN); Guangda Niu, Hubei (CN); Jiajun Luo, Hubei (CN); Qingsong Hu, Hubei (CN); Jing Liu, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 336 days.

(21) Appl. No.: 16/170,046

(22) Filed: Oct. 25, 2018

(65) Prior Publication Data

US 2019/0330074 A1    Oct. 31, 2019

(30) Foreign Application Priority Data

Apr. 27, 2018  (CN) .......................... 201810388893.X
Jun. 15, 2018  (CN) .......................... 201810622237.1

(51) Int. Cl.
  *C09K 11/62*  (2006.01)
  *C01G 29/00*  (2006.01)
  (Continued)

(52) U.S. Cl.
  CPC .......... *C01G 29/006* (2013.01); *H01L 33/26* (2013.01); *H01L 33/502* (2013.01); *C01P 2002/34* (2013.01); *C01P 2002/72* (2013.01); *C01P 2002/84* (2013.01); *C01P 2006/40* (2013.01); *C09K 11/628* (2013.01)

(58) Field of Classification Search
  CPC .............. C09K 11/628; C09K 11/7435; C09K 11/7705; C09K 11/772; C09K 11/7733; C09K 11/7748; C09K 11/7757; C09K 11/7763; C09K 11/7773
  See application file for complete search history.

(56) References Cited

U.S. PATENT DOCUMENTS 6,228,286 B1 *  5/2001  Leblans ............... C09K 11/615
                                                           250/362
2018/0290897 A1 * 10/2018  Snaith .................. C01G 29/006

OTHER PUBLICATIONS

Volonakis. Cs2InAgCl6: A New Lead-Free Halide Double Perovskite with Direct Band Gap. J. Phys. Chem. Lett. Aug. 2017, 772-778 (Year: 2017).*

* cited by examiner

Primary Examiner — Matthew E. Hoban
(74) Attorney, Agent, or Firm — JCIPRNET

(57) ABSTRACT

The present invention discloses a multi-element perovskite material, and a single crystal, powder and a film thereof, as well as the applications thereof in photoluminescence and electroluminescence, in which the multi-element perovskite material is a multi-element fully-inorganic salt of non-lead metal halide and has a perovskite structure; and the chemical formula of the multi-element perovskite material is $Cs_2Na_xAg_{1-x}In_yBi_{1-y}Cl_6$, wherein $0 \leq x \leq 1$, $0 \leq y \leq 1$. Meanwhile, based on the very strong self-trapped exciton states of the double perovskite, the present invention proposes a high-efficiency single-phase broadband phosphor and an electroluminescent device.

5 Claims, 21 Drawing Sheets

(51) Int. Cl.
*H01L 33/50* (2010.01)
*H01L 33/26* (2010.01)

MULTI-ELEMENT PEROVSKITE MATERIAL AS WELL AS PREPARATION AND LUMINESCENT APPLICATION THEREOF

CROSS-REFERENCE TO RELATED APPLICATION

This application claims the priority benefits of Chinese application serial no. 201810388893.X, filed on Apr. 27, 2018, and Chinese application serial no. 201810622237.1, filed on Jun. 15, 2018. The entirety of each of the above-mentioned patent applications is hereby incorporated by reference herein and made a part of specification.

BACKGROUND

Technical Field

The present invention belongs to the field of photoelectric materials, and more particularly, relates to a multi-element perovskite material as well as preparation and luminescent applications thereof. The multi-element perovskite material is a novel multi-element fully-inorganic salt of non-lead metal halide, and this perovskite material has excellent luminescence properties due to its peculiar self-trapped exciton (STE) states, and can be widely used in the fields of photoluminescence and electroluminescence.

Description of the Related Art

In the last few years, novel organic/inorganic hybrid perovskite materials have shown great application value in the fields of photovoltaic, luminescence, laser, photo detection and the likes, and have become one of the material research hot spots in the world. However, due to the lack of stability in continuous exposure to light, humidity, and high temperature, perovskite optoelectronic devices are facing many challenges. In addition, the toxicity of lead has also raised questions about the long-term environmental impact of perovskite solar cells.

A feasible solution to both stability and lead toxicity is to find relevant compounds through reasonable design. A solar cell with an efficiency of more than 6% has been produced by replacing Pb with Sn. In addition, $Cs_2AgBiBr_6$ and $Cs_2AgBiCl_6$ have been prepared by a monovalent element and trivalent element co-doping method. However, the material is too single to be adjusted. Meanwhile, non-lead perovskites are generally much worse in performance than lead-containing perovskites, making the non-lead perovskites greatly limited in practical photoelectric applications.

SUMMARY

In view of the above-described defects or improvement requirements, the present invention provides a multi-element perovskite material as well as preparation and luminescent application thereof. Compared with the prior arts, through improving the types and ratios of key chemical elements of the perovskite material, problems of the existing double perovskite material, such as few types, poor regulation and environmental pollution, can be effectively solved, and the present invention adopts a hydrothermal method to prepare the multi-element perovskite material, in which by controlling conditions (such as feed amount, hydrochloric acid concentration, reaction temperature and time) of the hydrothermal reaction, a single-phase phosphor with a broadband emission as well as a very high fluorescence yield is obtained. In order to further improve its luminescence property, a rare earth element is added to improve the luminescence quality. The present invention further proposes that a film with high fluorescence yield is prepared by the perovskite material, and is applied to a white-light electroluminescent device, which breaking the existing technology for realizing white light based on color mixing of red, green and blue LEDs.

According to an aspect of the present invention, a multi-element perovskite material is provided. The multi-element perovskite material is a multi-element fully-inorganic salt of non-lead metal halide and has a perovskite structure. The chemical formula of the multi-element perovskite material is $Cs_2Na_xAg_{1-x}In_yBi_{1-y}Cl_6$, wherein $0 \le x \le 1$, $0 \le y \le 1$, and x and y are not simultaneously equal to 0 or 1.

According to another aspect of the present invention, a method for preparing the multi-element perovskite material is provided. The method comprises respectively weighing powders of CsCl, NaCl, AgCl, $InCl_3$, and $BiCl_3$ according to the stoichiometric ratio of the chemical formula $Cs_2Na_xAg_{1-x}In_yBi_{1-y}Cl_6$, wherein $0 \le x \le 1$, $0 \le y \le 1$, and x and y are not simultaneously equal to 0 or 1; mixing the powders of CsCl, NaCl, AgCl, $InCl_3$, and $BiCl_3$ to form a powder mixture; mixing the powder mixture with concentrated hydrochloric acid having a mass percentage concentration of 30% to 38% to obtain a precursor mixture having a concentration of 0.5 M to 2 M; subjecting the precursor mixture to hydrothermal reaction at 160° C. to 220° C. for 5 to 10 hours; and cooling the precursor mixture to room temperature to obtain the multi-element perovskite material $Cs_2Na_xAg_{1-x}In_yBi_{1-y}Cl_6$ in power form when the cooling rate is larger than 10° C./h or in crystal form when the cooling rate is less than 3° C./h.

According to yet another aspect of the present invention, the use of the above multi-element perovskite material in photoluminescence (that is, phosphor) is provided. In one embodiment of the present invention, by optimizing values of x and y in $Cs_2Na_xAg_{1-x}In_yBi_{1-y}Cl_6$, a broadband single-phase phosphor with a fluorescence yield of up to 86% is provided. The emission spectrum of the phosphor covers the visible region of 400 nm to 800 nm and has a full width at half maximum of more than 150 nm. The broadband property of the broadband single-phase phosphor is caused by strong self-trapped exciton states resulting from the strong electron-phonon coupling in $Cs_2Na_xAg_{1-x}In_yBi_{1-y}Cl_6$ ($0.2 \le x \le 0.8$, $0.8 \le y \le 1$).

According to still another aspect of the present invention, a proposal for improving the above multi-element perovskite phosphor by adding a rare earth element is provided. By adding a rare earth chloride or oxide to the precursor solution, an improved phosphor $Cs_2Na_xAg_{1-x}In_zLn_{1-y-z}Cl_6$ (Ln represents a rare earth element, $0.2 \le x \le 0.8$, $0.8 \le y \le 1$, and $0 \le z < 0.2$) is prepared, which has a higher color rendering index and improved luminescence quality.

According to still another aspect of the present invention, a method for preparing a film with high fluorescence yield and composed of the above multi-element perovskite material is provided. The raw materials of CsCl, NaCl, AgCl, $InCl_3$ and $BiCl_3$ are deposited on a substrate by thermal evaporation. After the evaporation is completed, they need to be heated in a glove box for a period of time and then exposed to the air to be contact with moisture for a period of time such that the raw materials are fully reacted, and grain boundaries and defects are reduced. Then, the raw materials are put back into the glove box for heating and annealing to remove the moisture, thereby obtaining a multi-element perovskite film with a fluorescence yield of up to 50% or more. The method specifically comprises respectively evaporating raw materials of CsCl, NaCl, AgCl, InCl$_3$, and BiCl$_3$ according to the stoichiometric ratio of Cs$_2$Na$_x$Ag$_{1-x}$In$_y$Bi$_{1-y}$Cl$_6$ (0.2≤x≤0.8, 0.8≤y≤1) under vacuum at a deposition rate of 1 Å/s or less to form a multi-layered thin film on a substrate; heating the multi-layered thin film at 100° C. to 200° C. for a period of time; exposing the multi-layered thin film to moisture in the air for 5 to 15 minutes; and heating the multi-layered thin film at 100° C. to 200° C. for a period of time to obtain a perovskite film with high fluorescence yield.

Preferably, the evaporation is performed in an order such that NaCl and AgCl are successively evaporated, and BiCl$_3$ and InCl$_3$ are successively evaporated.

According to still another aspect of the present invention, the present invention provides a single-phase white-light electroluminescent device, the white-light electroluminescent device has a planar heterojunction structure, and successively includes a transparent conductive substrate, a first transport layer, a light-emitting layer, a second transport layer and a metal electrode, and the light-emitting layer is made of the multi-element perovskite material Cs$_2$Na$_x$Ag$_{1-x}$In$_y$Bi$_{1-y}$Cl$_6$, wherein 0.2≤x≤0.8, and 0.8≤y≤1. The larger the Na content is, the worse the electron transport performance is, but too little Na may cause a decrease in fluorescence yield. Thus, the light-emitting layer is preferably a multi-element perovskite material having the chemical formula of Cs$_2$Na$_{0.33}$Ag$_{0.67}$In$_{0.99}$Bi$_{0.01}$Cl$_6$.

Through the above technical solution conceived by the present invention, compared with the prior art, a multi-element fully-inorganic non-lead perovskite material Cs$_2$Na$_x$Ag$_{1-x}$In$_y$Bi$_{1-y}$Cl$_6$ that can be continuously adjusted in composition is obtained by replacing the B-position in element in the conventional lead-based perovskite ABX$_3$ with multi-element non-lead halides. The multi-element fully-inorganic non-lead perovskite material, which is an environmentally friendly material, contains no organic materials and lead, and the ratio of NaCl and AgCl as well as the ratio of InCl$_3$ and BiCl$_3$ are continuously adjusted arbitrarily, so that properties of the material, such as forbidden band width, conductivity and fluorescence yield, are continuously adjusted, resulting in a wider application.

In the present invention, a hydrothermal method is used to synthesize a multi-element perovskite material, and the high temperature created by the hydrothermal method is used to overcome the problem that the low solubility of the inorganic perovskite results in low synthesis efficiency in the cooling precipitation, also avoiding the problem that the solid-phase synthesis requires high temperature environment and the reaction is insufficient. Thus, the multi-element perovskite material can be efficiently synthesized.

In the present invention, a single-phase phosphor taking both spectral width and fluorescence efficiency into account is obtained by optimizing components, and has a great application potential in illumination, which can avoid the problem that the spectrum changes with the intensity of the excitation light and the wavelength of the excitation light due to mixing of different phosphors. Meanwhile, this phosphor also has very good temperature stability and light stability. Further, in the present invention, by adding a rare earth oxide or chloride to the precursor solution, some rare earth ions occupy the positions of In and Bi, and luminescence of both self-trapped excitons (STE) and rare earth ions is allowed, thereby further increasing the color rendering index and improving the luminescence quality.

In the present invention, by applying such a perovskite material with properties of high yield and broad band to a light-emitting layer of a white-light electroluminescent device, an electroluminescent device having a broader single emission peak, compared to a conventional electroluminescent device, is prepared.

DETAILED DESCRIPTION OF THE EMBODIMENTS

Figure 1:
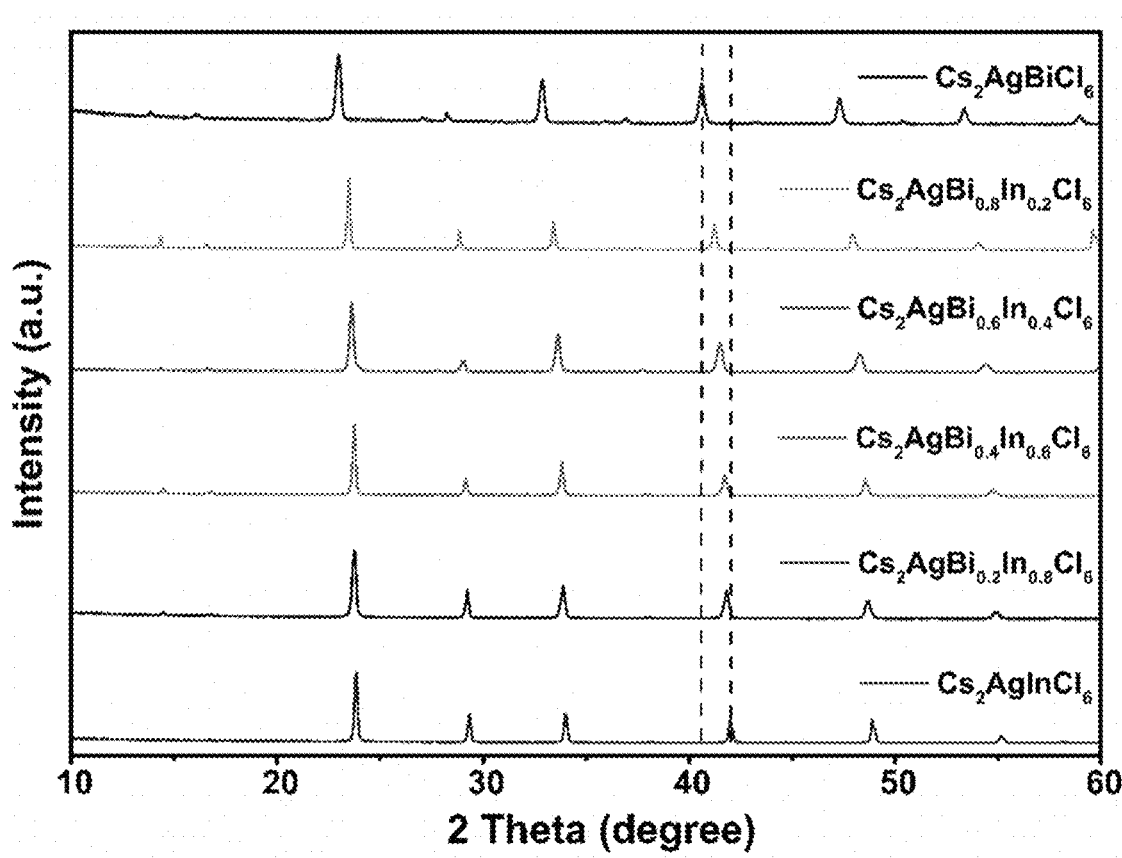
FIG. 1 shows X-ray diffraction patterns of Cs$_2$AgIn$_x$Bi$_{1-x}$Cl$_6$, prepared in Embodiments 1-4 in which x is respectively 0.2, 0.4, 0.6 and 0.8, as well as X-ray diffraction patterns of Cs$_2$AgBiCl$_6$ and Cs$_2$AgInCl$_6$ (formed when x is respectively 0 and 1) as a comparison.
Figure 2:
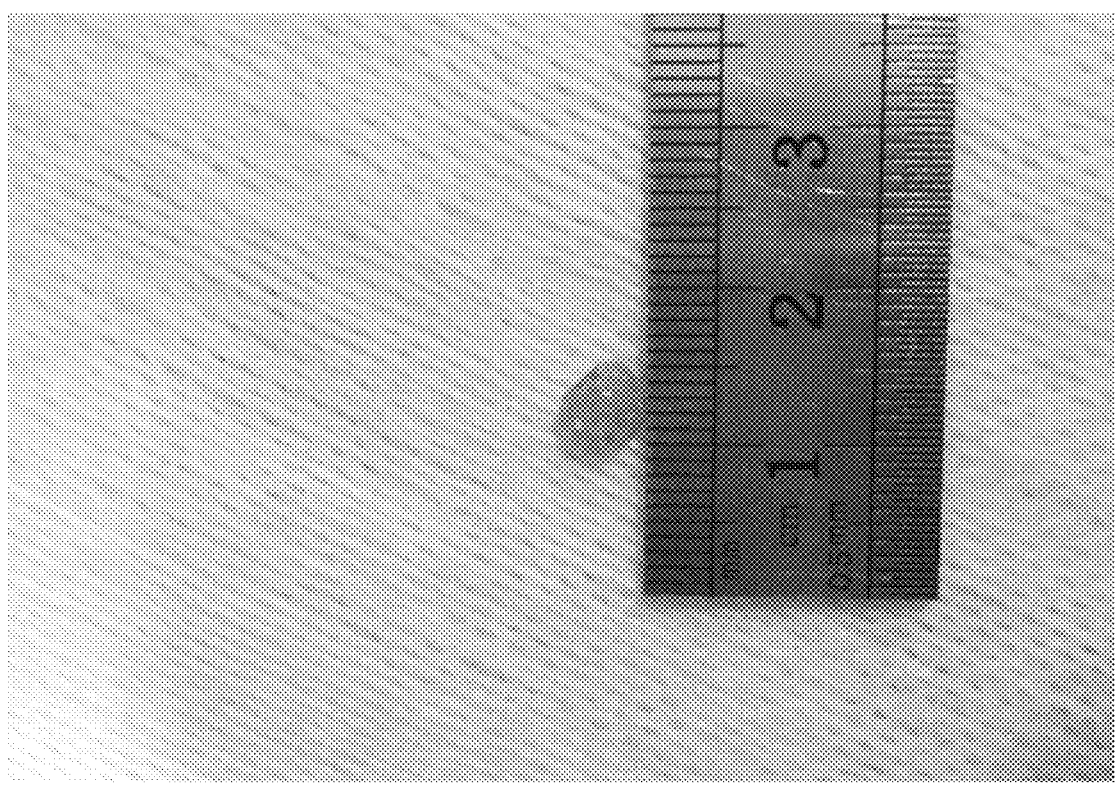
FIG. 2 shows an image of a single crystal of Cs$_2$AgIn$_{0.2}$Bi$_{0.8}$Cl$_6$ prepared in Embodiment 1. It can be seen that the size of the single crystal reaches 5 mm.
Figure 3:
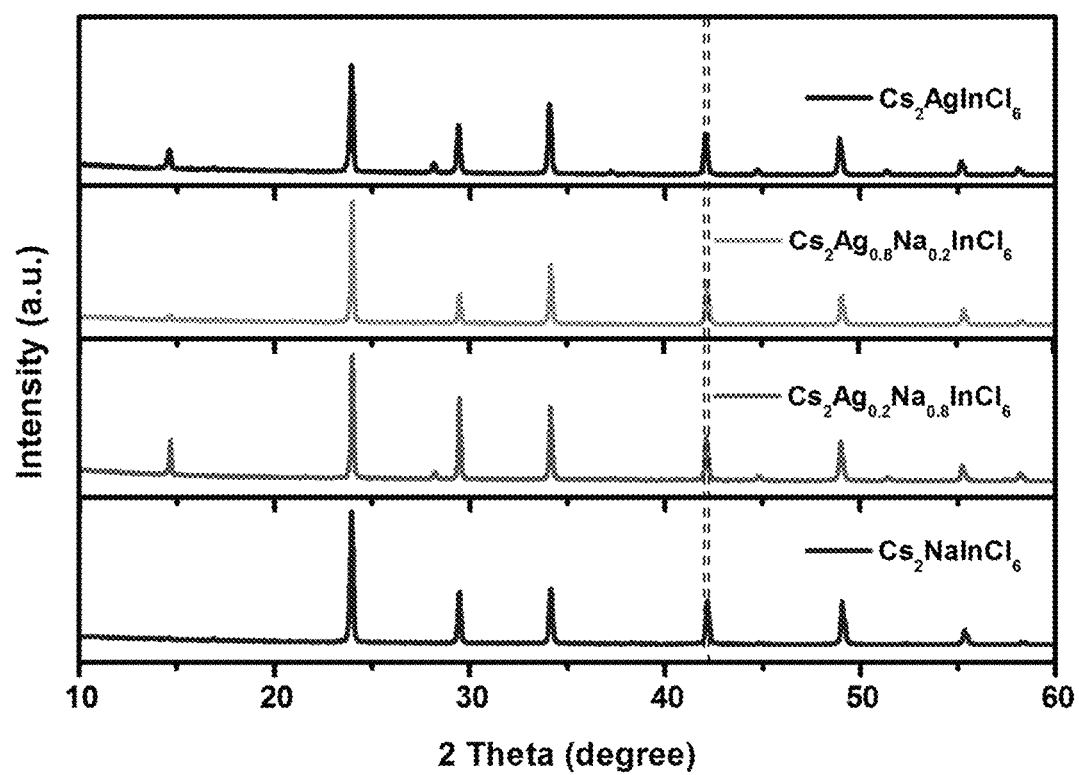
FIG. 3 shows X-ray diffraction patterns of Cs$_2$Na$_x$Ag$_{1-x}$InCl$_6$ prepared in Embodiments 5 and 8 in which x is respectively 0.2 and 0.8, as well as X-ray diffraction patterns of Cs$_2$AgInCl$_6$ and Cs$_2$NaInCl$_6$ (formed when x is respectively 0 and 1) as a comparison.
Figure 4:
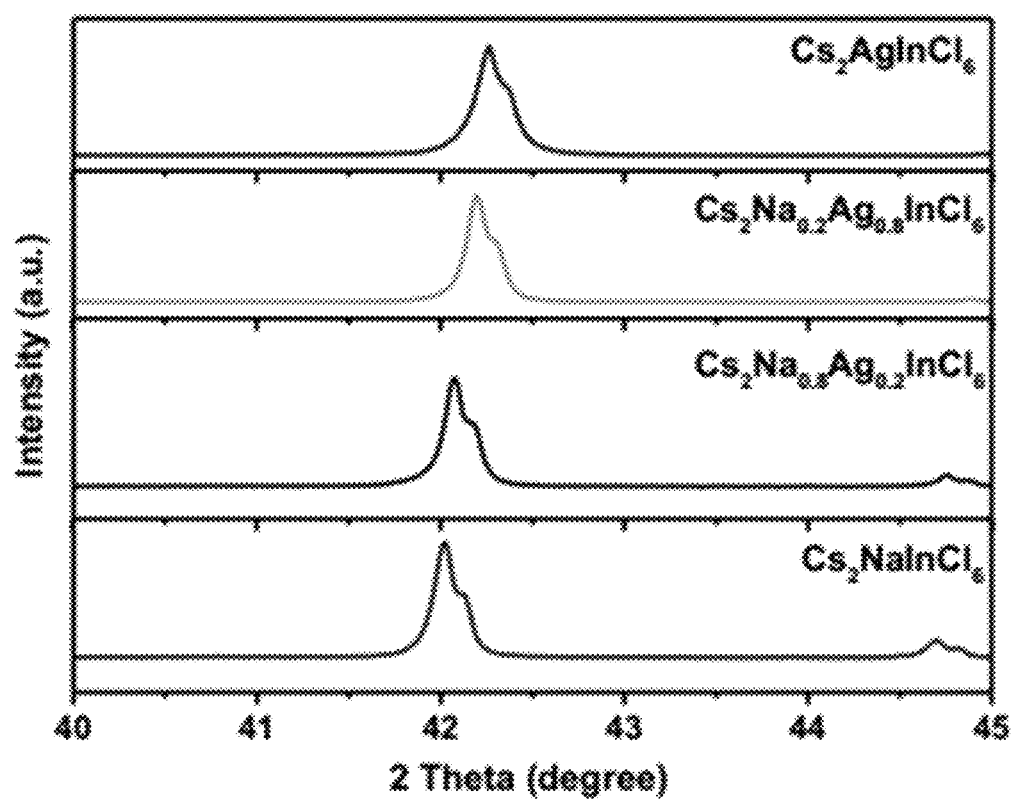
FIG. 4 shows X-ray diffraction patterns of four samples in FIG. 3 from 40 to 45 degrees.
Figure 5:
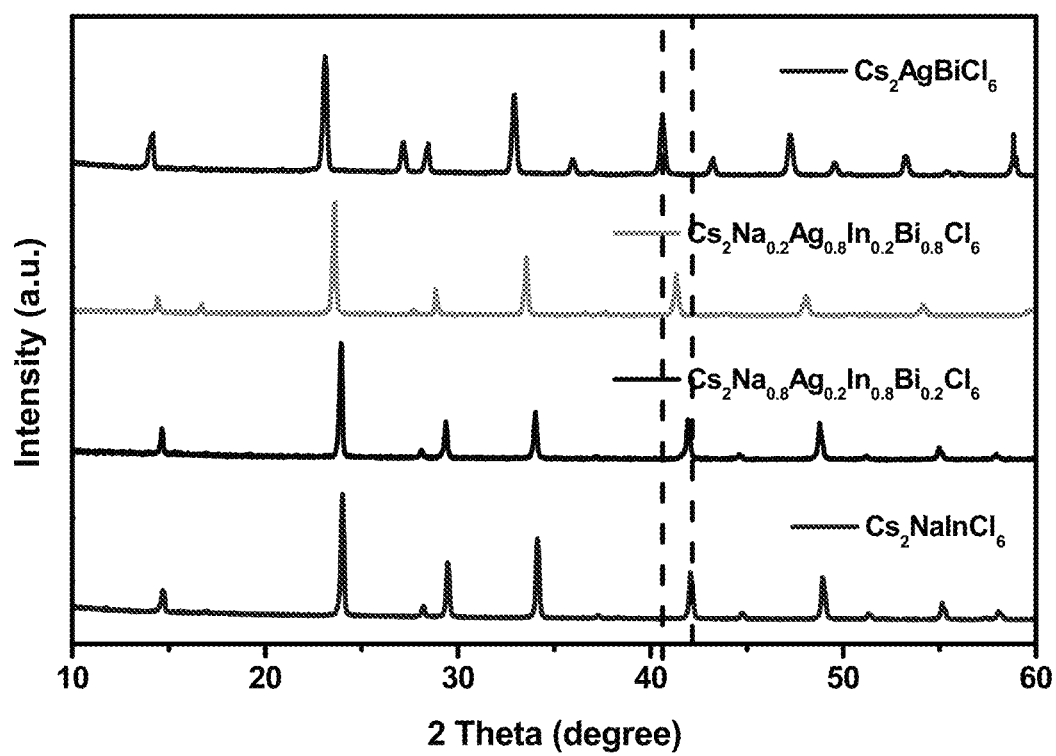
FIG. 5 shows X-ray diffraction patterns of Cs$_2$Na$_x$Ag$_{1-x}$In$_y$Bi$_{1-y}$Cl$_6$ prepared in Embodiments 9 and 10, in which for more obvious movement of the diffraction peaks, x and y are simultaneously 0.8 in Embodiment 9, and x and y are simultaneously 0.2 in Embodiment 10, as well as X-ray diffraction patterns of Cs$_2$NaInCl$_6$ (formed when x and y are simultaneously 1) and Cs$_2$AgBiCl$_6$ (formed when x and y are simultaneously 0) as a comparison.
Figure 6:
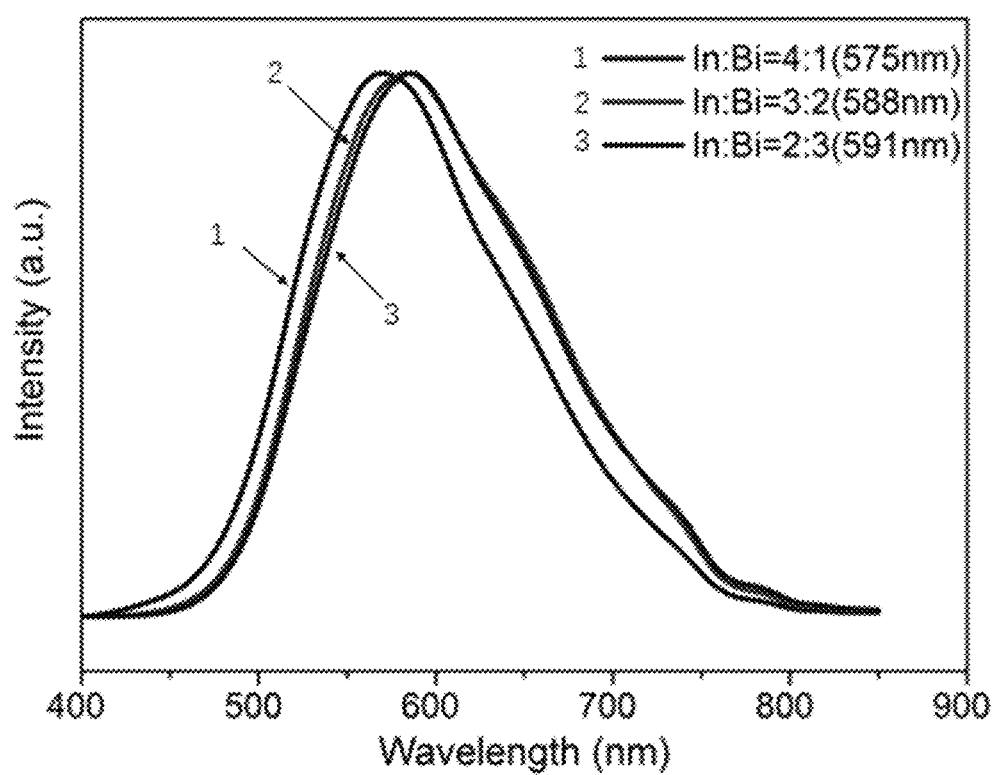
FIG. 6 shows a fluorescence spectrum of Cs$_2$AgIn$_x$Bi$_{1-x}$Cl$_6$, indicating a very wide spectrum covering the visible light region.
Figure 7:
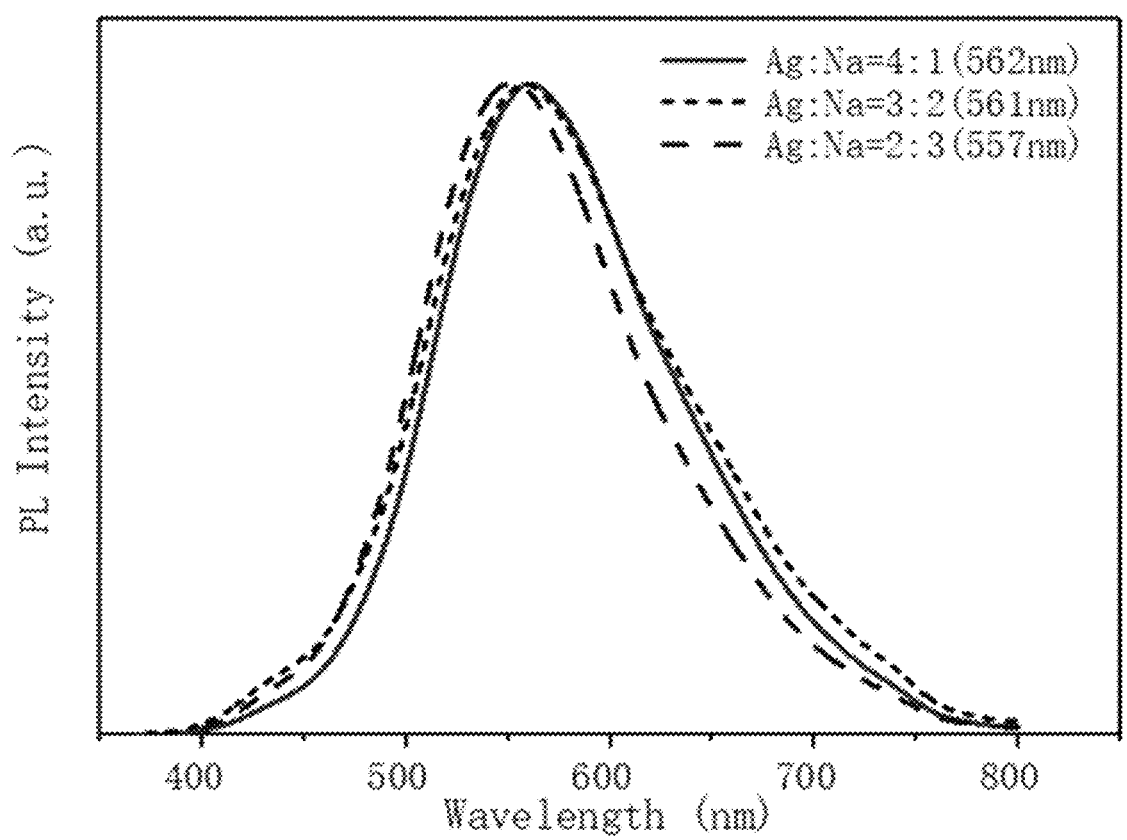
FIG. 7 shows a fluorescence spectrum of Cs$_2$Na$_x$Ag$_{1-x}$InCl$_6$, also indicating a very wide spectrum covering the visible light region.
Figure 8:
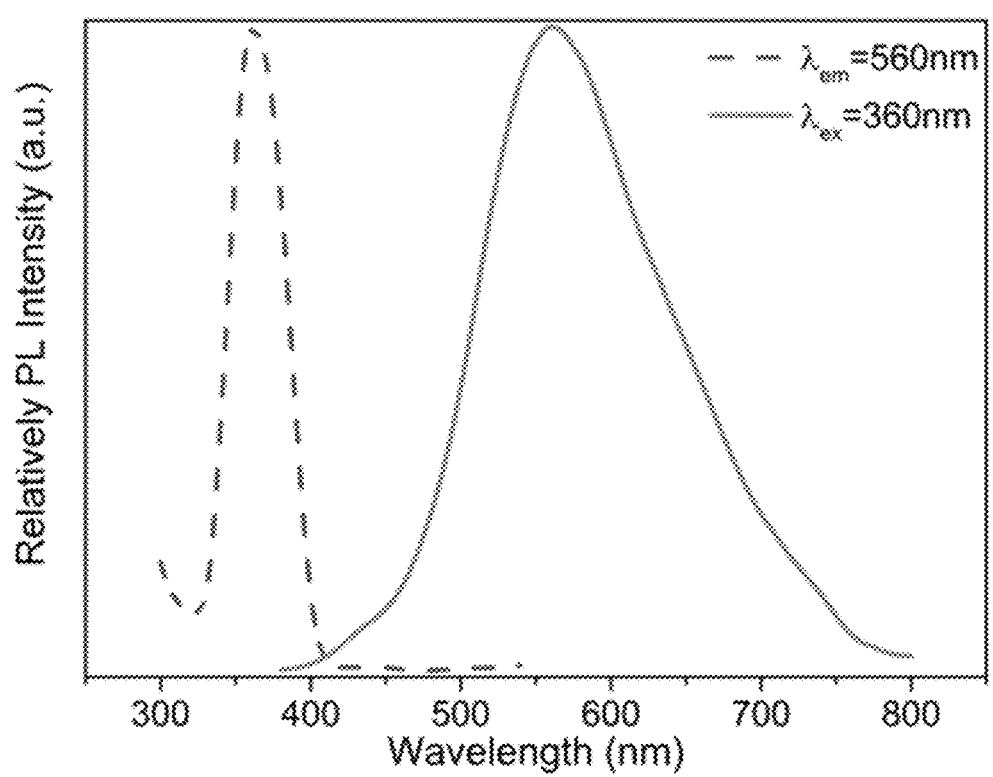
FIG. 8 shows an excitation spectrum and a fluorescence spectrum of Cs$_2$Na$_{0.4}$Ag$_{0.6}$InCl$_6$, from which it can be seen that the optimum excitation wavelength of the phosphor is 360 nm to 380 nm.
Figure 9:
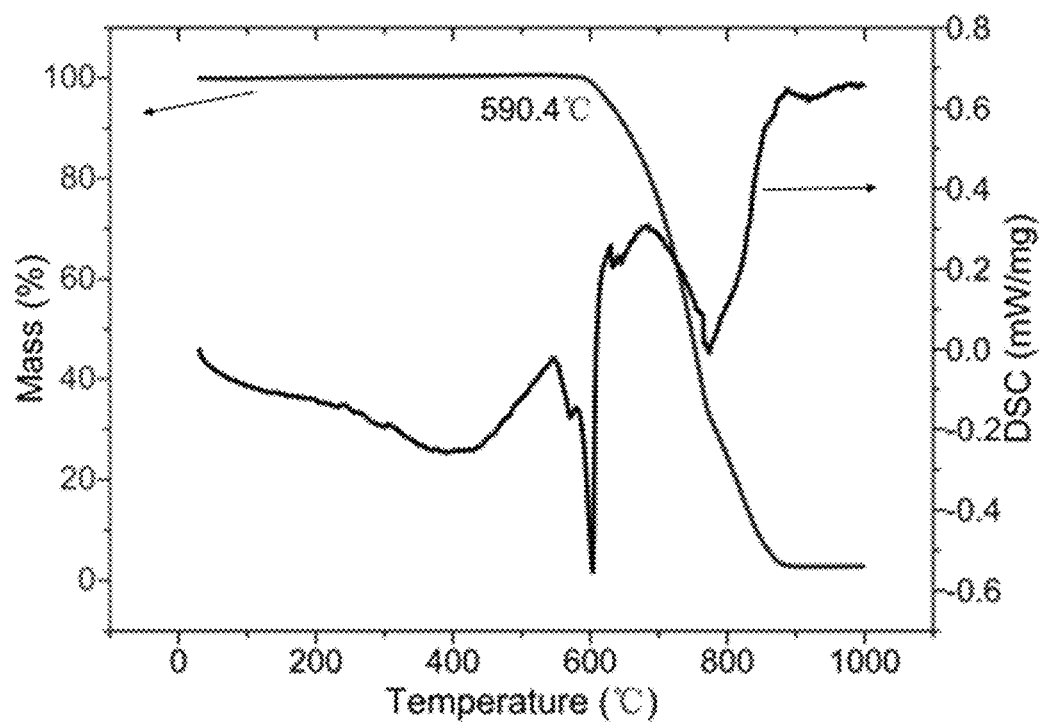
FIG. 9 shows a thermogravimetric analysis diagram of Cs$_2$Na$_{0.4}$Ag$_{0.6}$InCl$_6$, from which it can be seen that the thermal decomposition temperature of the multi-element perovskite is as high as 590.4° C.
Figure 10:
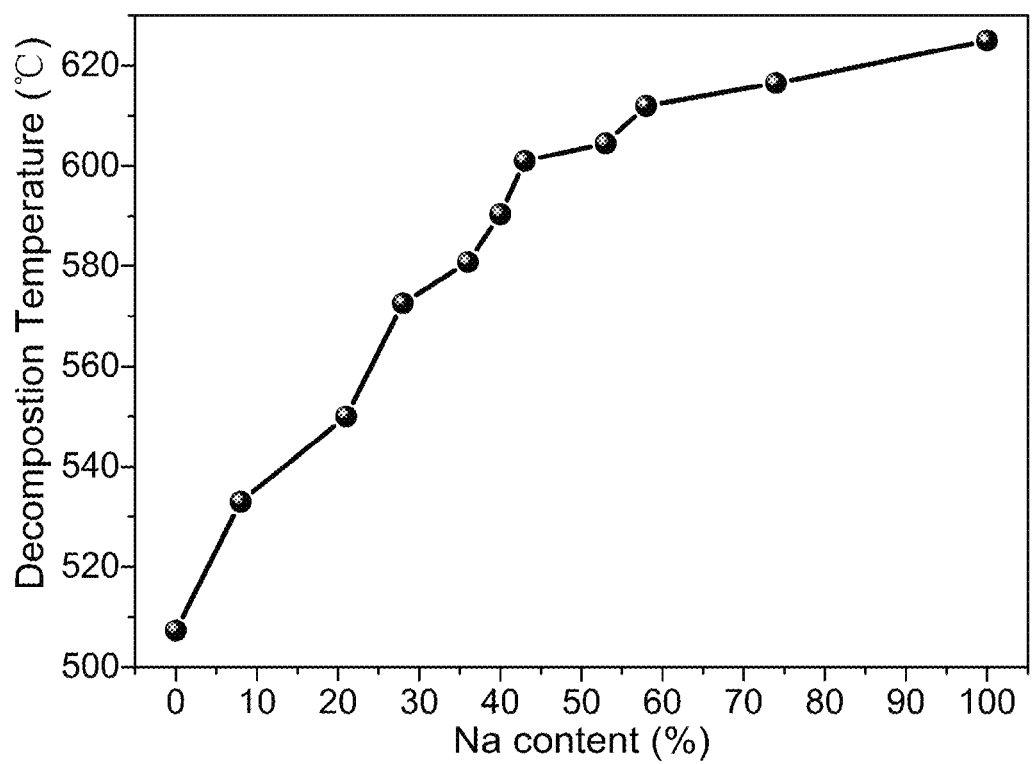
FIG. 10 is a graph showing the change in thermal stability of Cs$_2$Na$_x$Ag$_{1-x}$In$_{0.99}$Bi$_{0.01}$Cl$_6$ with Na content, from which it can be seen that the thermal stability of the perovskite gradually increases as the Na content increases.
Figure 11:
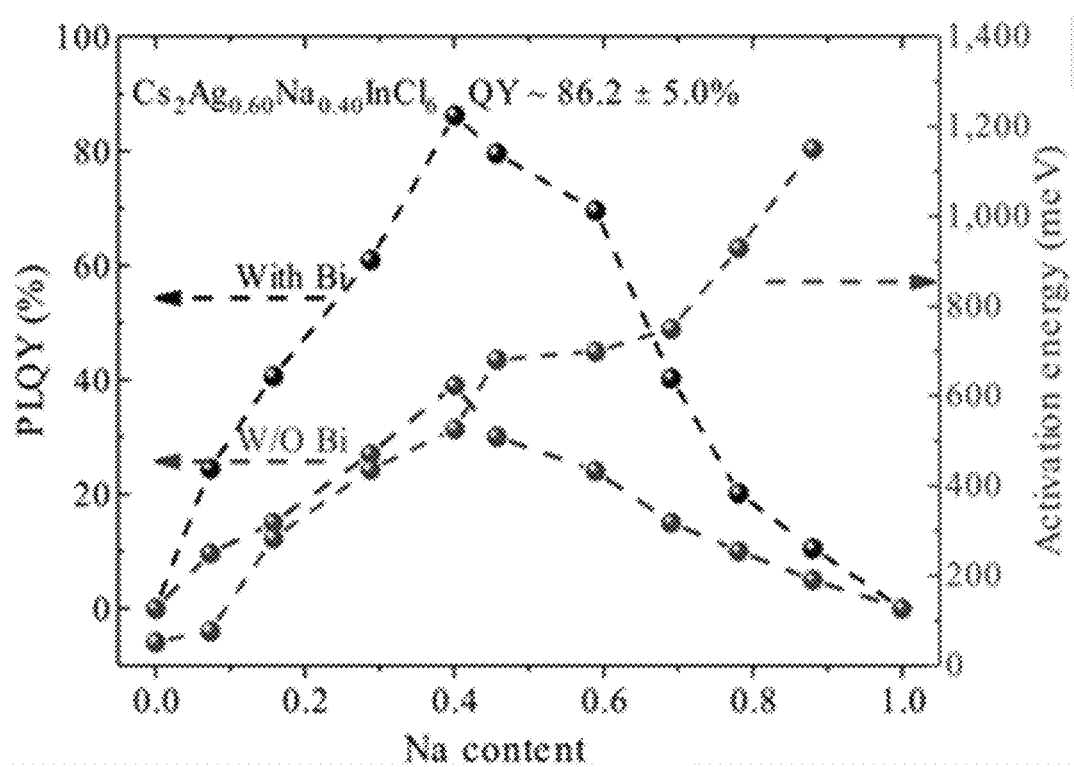
FIG. 11 is a graph showing the change in the fluorescence yield and activation energy of Cs$_2$Na$_x$Ag$_{1-x}$InCl$_6$ and Cs$_2$Na$_x$Ag$_{1-x}$In$_{0.99}$Bi$_{0.01}$Cl$_6$ with the Na content varied, from which it can be seen that as the Na content increases, the activation energy is raised monotonically and is much larger than that of the general luminescent substance, which directly leads to a very high temperature stability of the fluorescence spectrum. Further, when the Na content is in the range of 0.2 to 0.8, the perovskite has a higher fluorescence yield.
Figure 12:
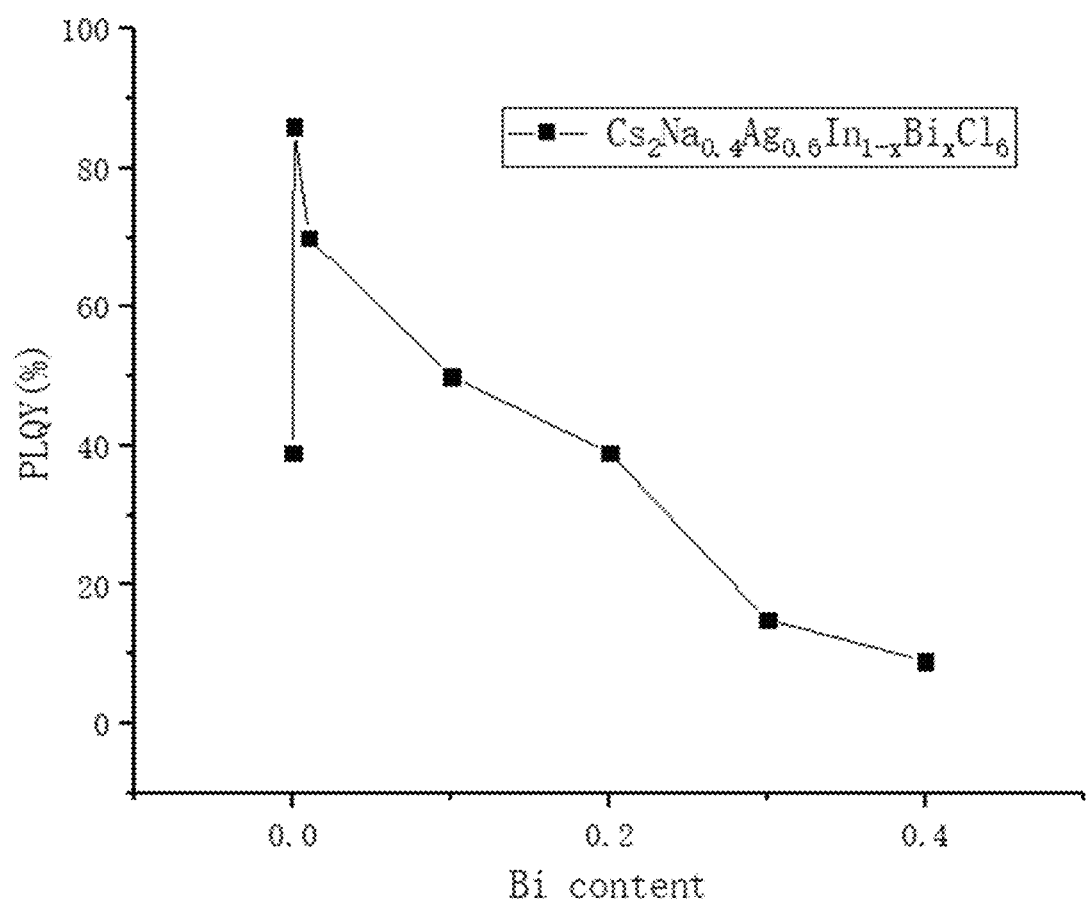
FIG. 12 is a graph showing the change in the fluorescence yield of Cs$_2$Na$_{0.4}$Ag$_{0.6}$In$_{1-x}$Bi$_x$Cl$_6$, from which it can be seen that when the Bi content is in the range of 0 to 0.2, the perovskite has a higher fluorescence yield.
Figure 13:
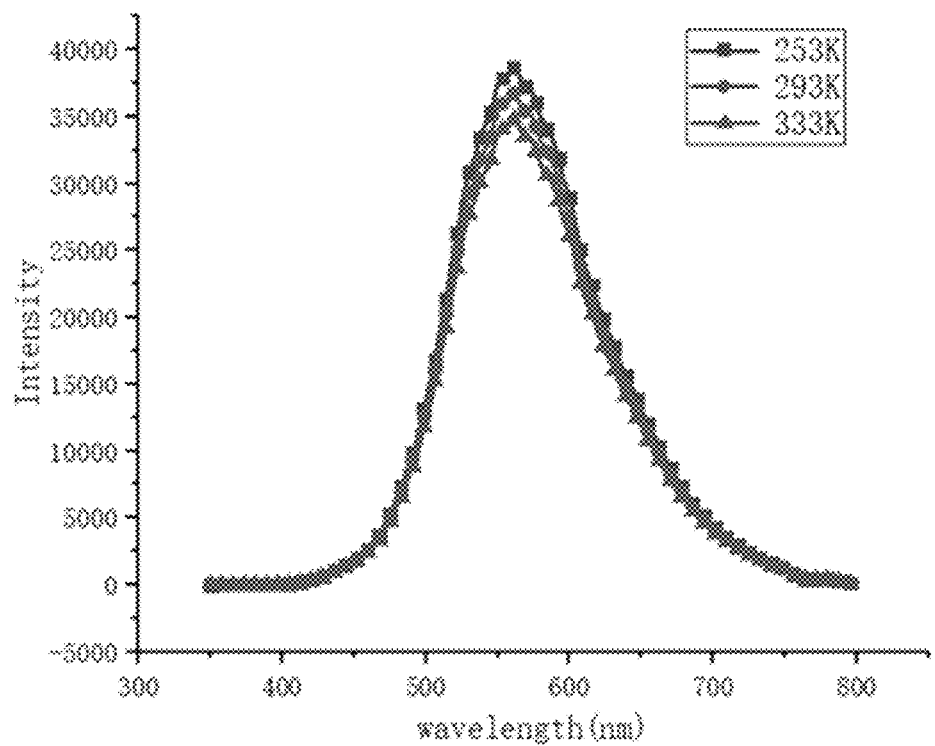
FIG. 13 shows a temperature-dependent spectrum of Cs$_2$Na$_{0.46}$Ag$_{0.54}$InCl$_6$, from which it can be seen that since the activation energy is large, the spectrum and intensity are hardly affected by the temperature.
Figure 14:
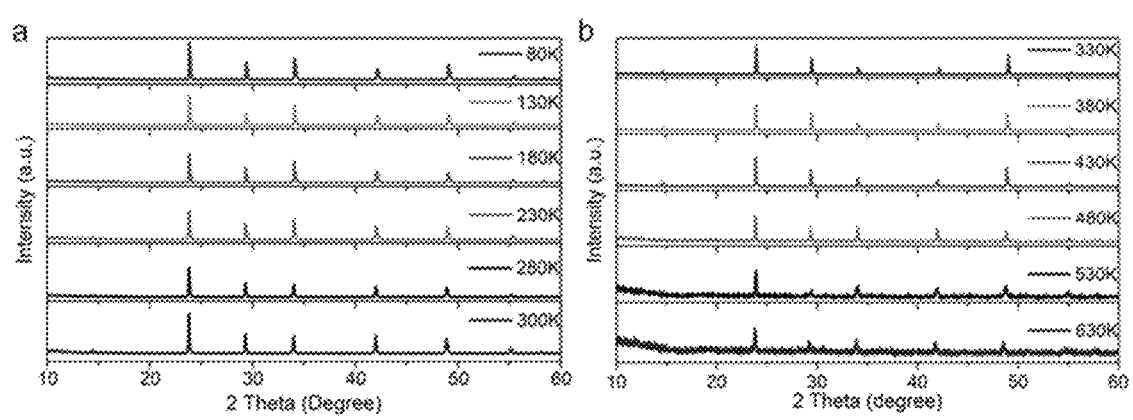
FIG. 14 shows a temperature-dependent XRD pattern of Cs$_2$Na$_{0.4}$Ag$_{0.6}$InCl$_6$, from which it can be seen that there is no obvious phase transition from 80 K to 630 K, which is also consistent with thermogravimetric analysis.
Figure 15:
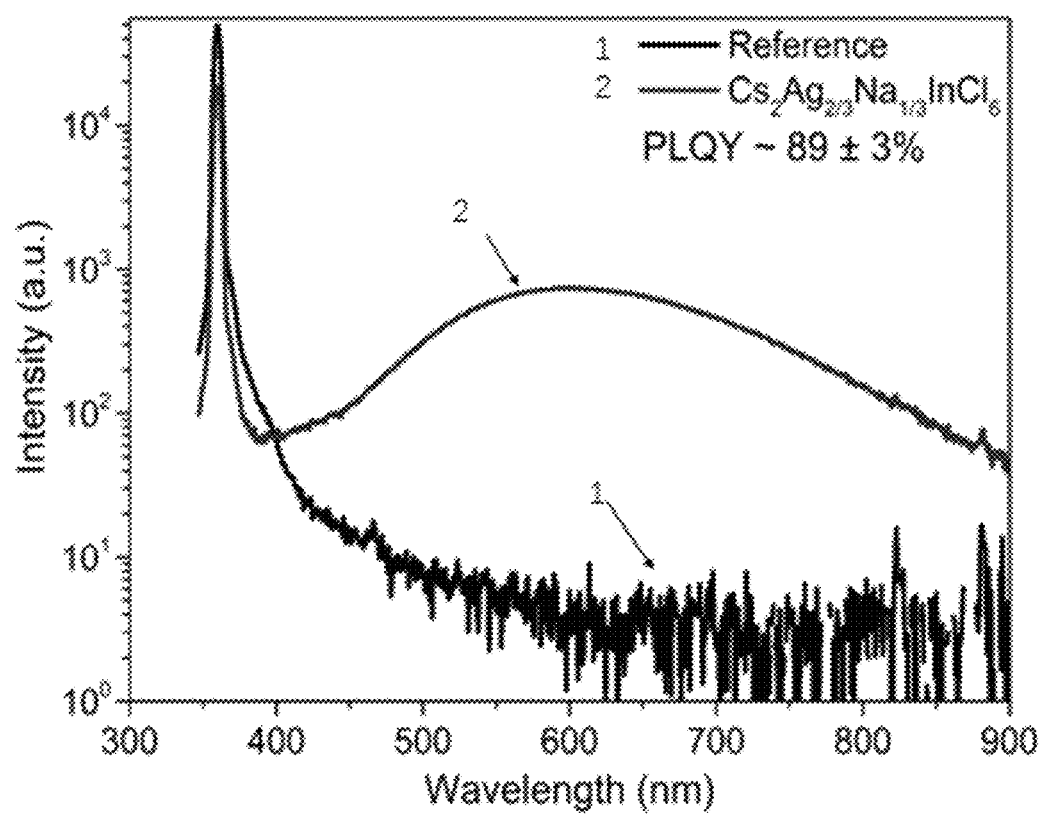
FIG. 15 shows a test result of the fluorescence yield of $Cs_2Na_{0.33}Ag_{0.67}InCl_6$, from which it can be seen that the fluorescence yield is as high as 89%, which is comparable to or even higher than that of the mainstream phosphors on the market.
Figure 16:
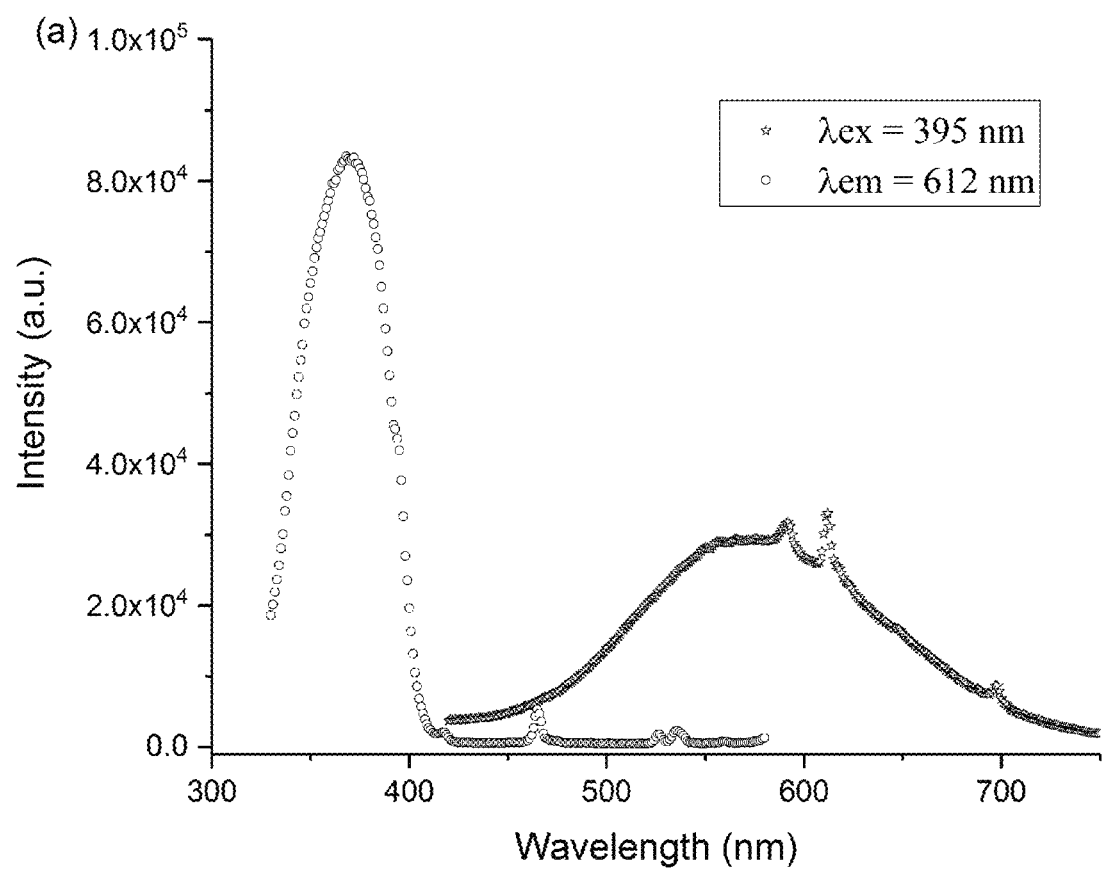
FIG. 16 shows an excitation spectrum and an emission spectrum of a Eu doped perovskite phosphor prepared in Embodiment 11 of the present invention.
Figure 17:
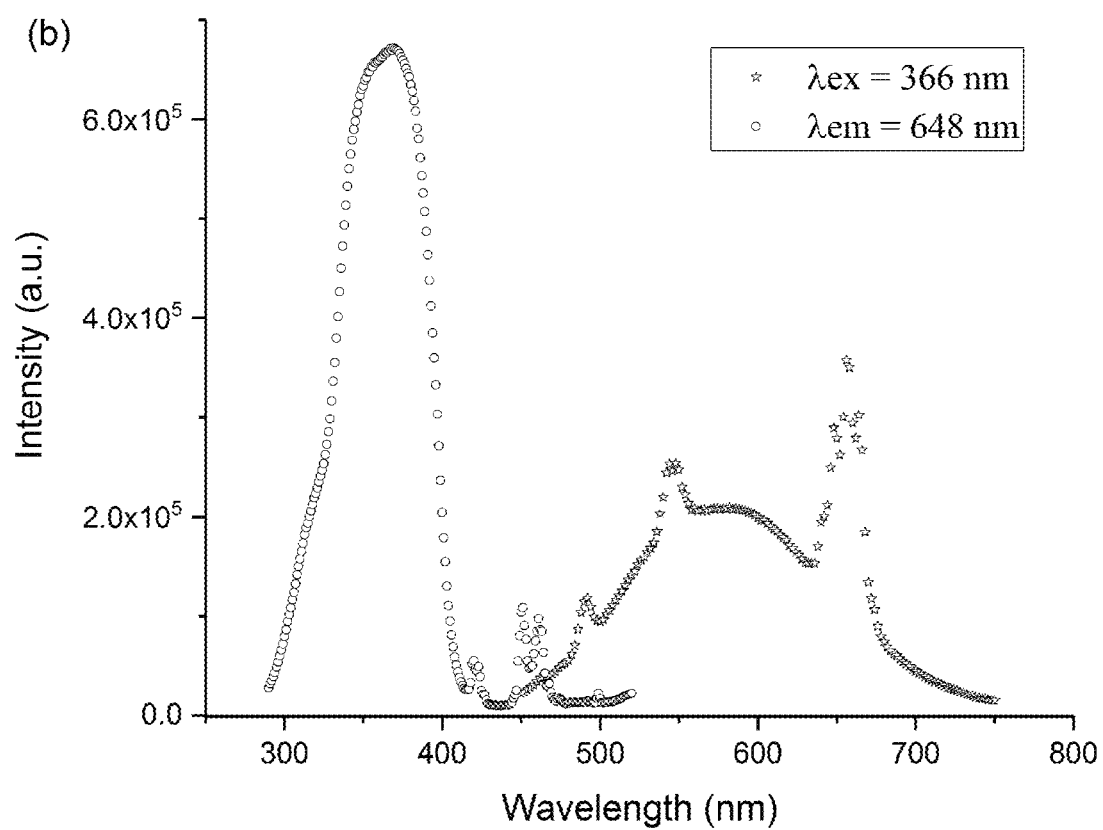
FIG. 17 shows an excitation spectrum and an emission spectrum of a Ho doped perovskite phosphor prepared in Embodiment 12 of the present invention.
Figure 18:
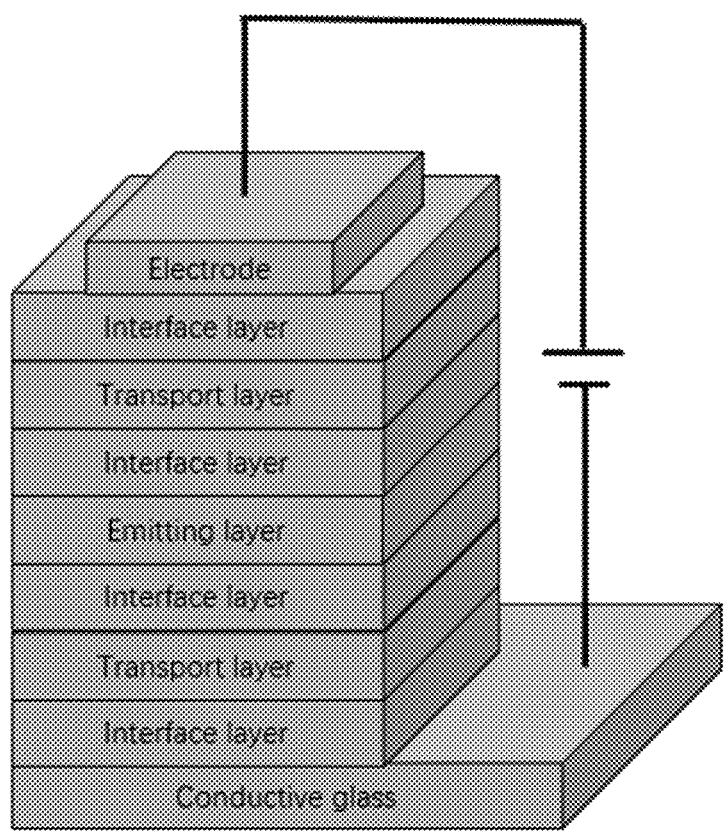
FIG. 18 is a diagram showing the structure of a white-light electroluminescent device according to the present invention.
Figure 19:
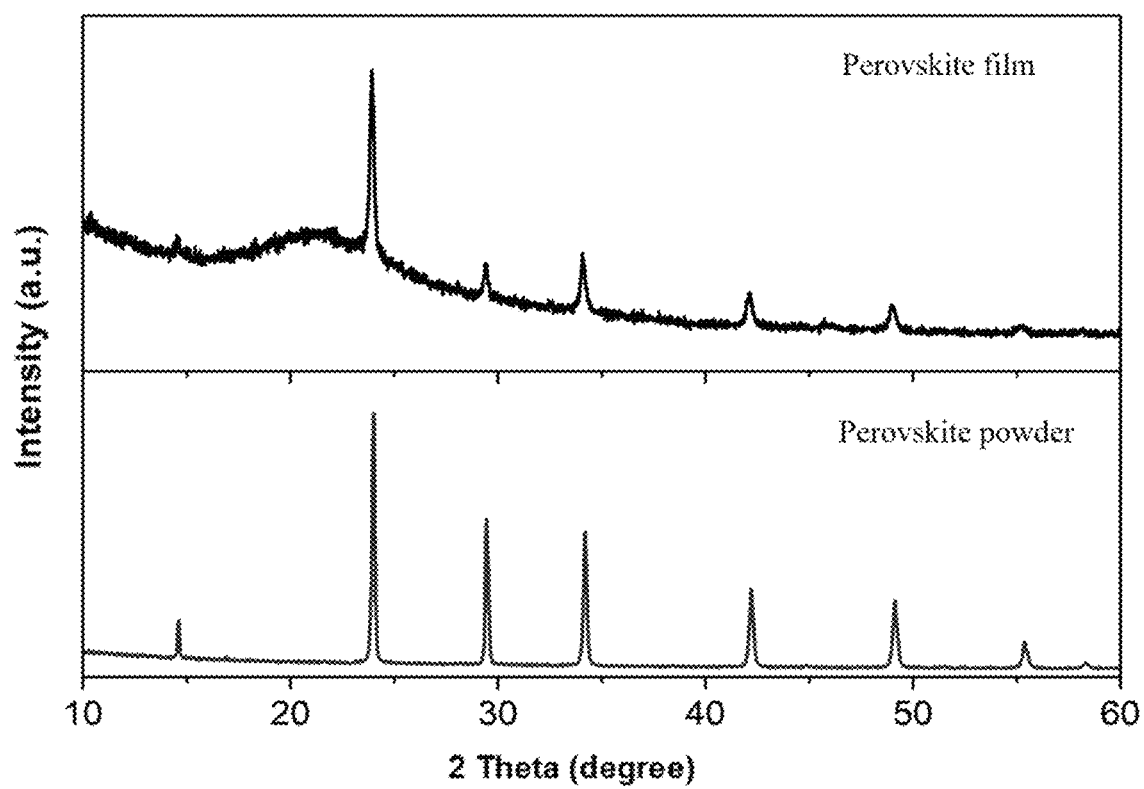
FIG. 19 shows an X-ray diffraction (XRD) spectrum of an active layer of a perovskite film with high fluorescence yield prepared in Embodiment 13.
Figure 20:
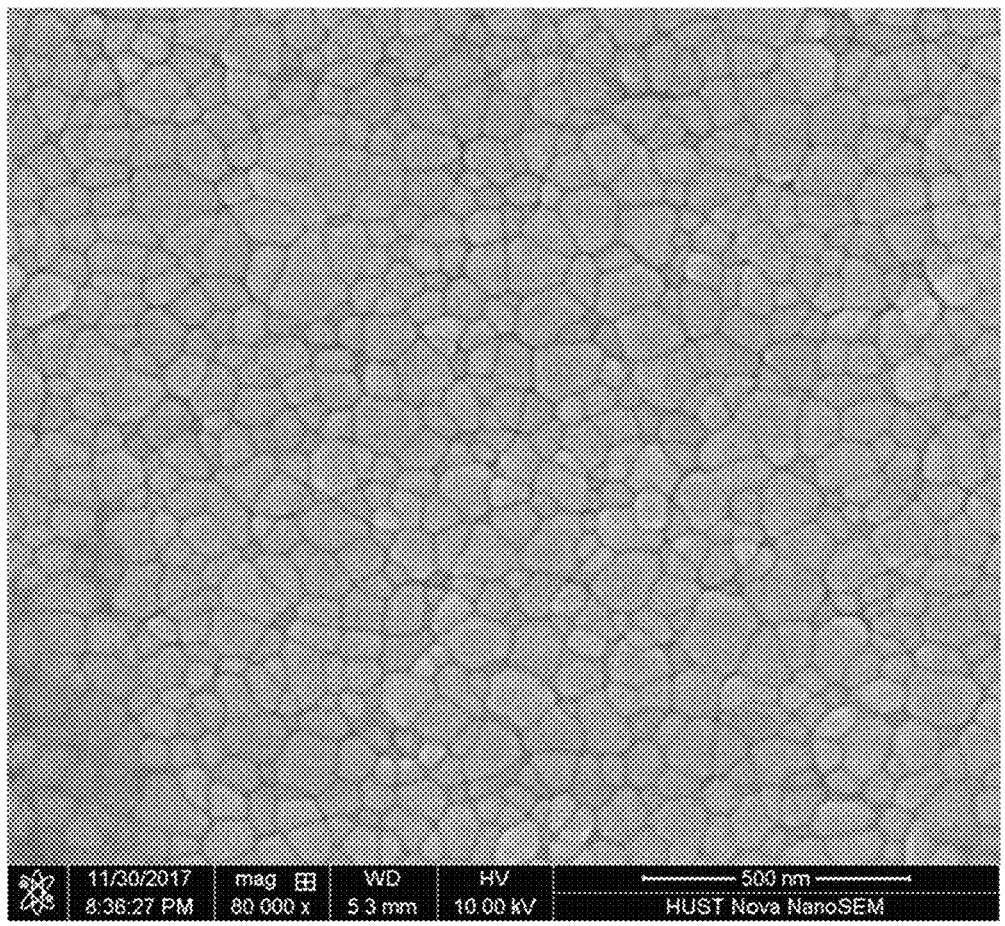
FIG. 20 shows a scanning electron microscope (SEM) image of the perovskite film with high fluorescence yield prepared in Embodiment 13.
Figure 21:
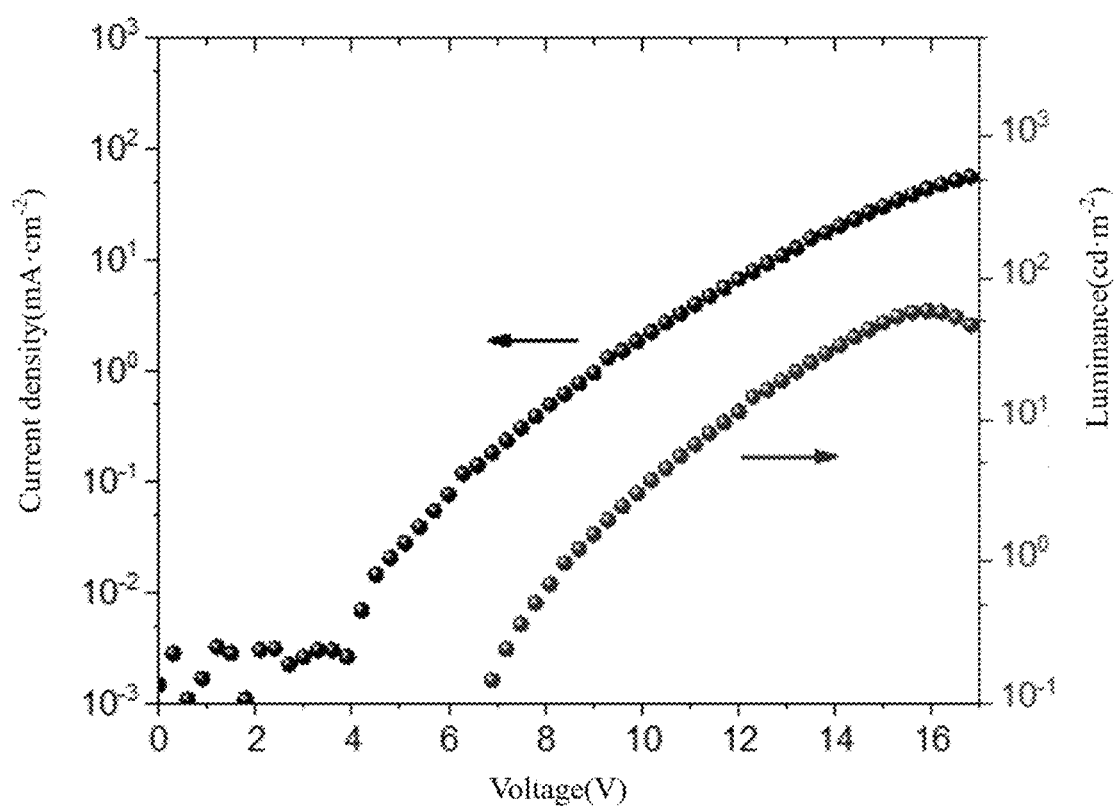
FIG. 21 shows luminance-voltage and current density-voltage curves of a white-light electroluminescent device prepared in Embodiment 17.
Figure 22:
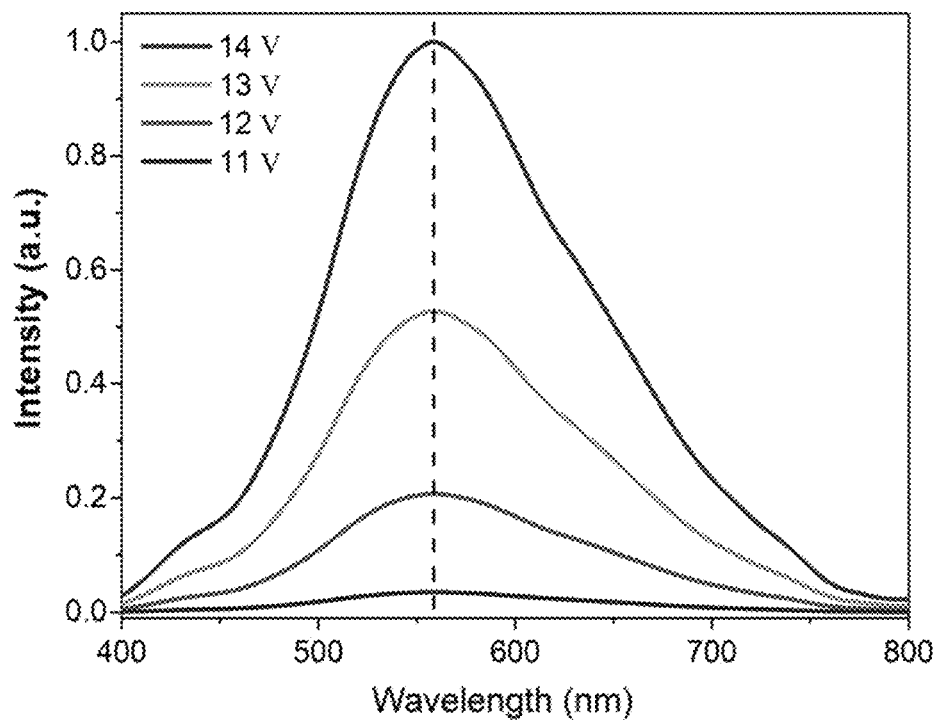
FIG. 22 shows electroluminescence spectrums of the white-light electroluminescent device prepared in Embodiment 17 at different voltages.
Figure 23:
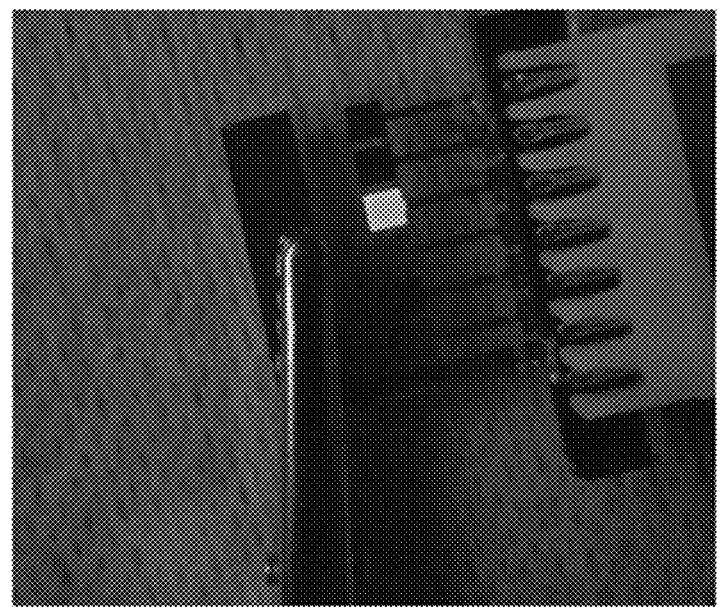
FIG. 23 is a picture of the white-light electroluminescent device prepared in Embodiment 17.

For clear understanding of the aspects, features and advantages of the present invention, detailed description of the present invention will be given below in conjunction with accompanying drawings and specific embodiments. It should be noted that the embodiments described herein are only meant to explain the present invention, and not to limit the scope of the present invention. Furthermore, the technical features related to the embodiments of the invention described below can be mutually combined if they are not found to be mutually exclusive.

A multi-element perovskite material of the present invention is a multi-element fully-inorganic salt of non-lead metal halide which is continuously adjustable in composition and has a perovskite structure, and the chemical formula thereof is $Cs_2Na_xAg_{1-x}In_yBi_{1-y}Cl_6$, wherein $0 \leq x \leq 1$, and $0 \leq y \leq 1$.

Further, the monovalent metal halides NaCl and AgCl are continuously adjustable in any ratio, and the trivalent metal halides $InCl_3$ and $BiCl_3$ are also continuously adjustable in any ratio. In addition, the ratio of the monovalent metal halides NaCl and AgCl is independent from the ratio of the trivalent metal halides $InCl_3$ and $BiCl_3$.

The above multi-element fully-inorganic salt of non-lead metal halide perovskite material (which is continuously adjustable in composition) is prepared by using metal halides CsCl, NaCl, AgCl, $InCl_3$, $BiCl_3$ and inorganic solvent hydrochloric acid, and the preparation method can include, for example, the following steps:

(1) At room temperature (such as 10° C. to 30° C.), NaCl and AgCl powders are weighed in a molar ratio of x: (1-x), as well as $InCl_3$ and $BiCl_3$ powders are weighed in a molar ratio of y: (1-y). The sum of mole numbers of the NaCl and AgCl powders is equal to the sum of mole numbers of the $InCl_3$ and $BiCl_3$ powders. The mole number of CsCl powder is equal to the sum of the mole numbers of NaCl, AgCl, $InCl_3$ and $BiCl_3$ powders. The powders are mixed evenly.

(2) The mixed powders are placed in a teflon chamber of a hydrothermal synthesis reactor, and concentrated hydrochloric acid (the mass percentage concentration of the concentrated hydrochloric acid may be 30% to 38%) is added in to prepare a precursor solution with a concentration of 0.5 M to 2 M. The hydrothermal synthesis reactor are assembled and placed in a muffle furnace to be heated for a period of time (for example, heat preservation is performed at a temperature of 160° C. to 220° C. for 5 to 10 hours) and then slowly cooled, thereby obtaining a perovskite material $Cs_2Na_xAg_{1-x}In_yBi_{1-y}Cl_6$ ($0 \leq x \leq 1$, and $0 \leq y \leq 1$). When the cooling rate is faster than 10° C./h, powder is obtained. When the cooling rate is slower than 3° C./h, a crystal is obtained.

When x and y in $Cs_2Na_xAg_{1-x}In_yBi_{1-y}Cl_6$ are given appropriate values ($0.3 \leq x \leq 0.7$, $0.8 \leq y \leq 1$), the multi-element perovskite material has a high fluorescence yield and can be used as a phosphor.

In the present invention, a method for preparing a rare earth modified phosphor is different from the method for preparing the above perovskite material only in that a rare earth halide or oxide is further added in the step of mixing the powders. By using the rare earth ions and the self-trapped excitons of the perovskite to illuminate together, white light with better quality can be obtained.

In the present invention, a perovskite film with high fluorescence yield is prepared by a thermal evaporation method, in which raw materials are the same as that in the solution method, i.e., metal halides, and evaporation is performed according to the stoichiometric ratio of $Cs_2Na_xAg_{1-x}In_yBi_{1-y}Cl_6$, and the order of evaporation is not required. After the evaporation is completed, a film without fluorescence is deposited, and needs to be treated as follows. Firstly, the film is placed on a heating stage of a glove box in a nitrogen atmosphere to heat it, so that the raw materials can fully react to generate a perovskite phase. The film is taken out of the glove box to be exposed to the air, so that with the moisture, crystallization occurs in the film to reduce grain boundaries and defects. Finally, the film is taken into the glove box to be continuously heated and annealed so as to remove the moisture, thereby obtaining a film with high fluorescence yield.

A luminescent active layer of a white-light electroluminescent device of the present invention adopts the above-mentioned film with high fluorescence yield, and the device structure adopts planar heterojunction of a classic sandwich. The specific structure of the white-light electroluminescent device comprises a transparent conductive substrate, a first transport layer, an light-emitting layer, a second transport layer, an interface layer and a metal electrode laminated in sequence. The inorganic material used in the transparent conductive substrate is one of zinc oxide, tin oxide and indium tin oxide. Preferably, a modified layer is further disposed between the transparent conductive substrate and the first transport layer to change the work function of the transparent conductive substrate. The first transport layer and the second transport layer are made of classical inorganic or organic compounds such as ZnO, $SnO_2$, TAPC and TPBi.

The following are specific embodiments.

Embodiment 1

In this embodiment, a method for preparing a perovskite single crystal is specifically as follows.

a) The teflon chamber was washed with deionized water for 10 min. The teflon chamber was washed with acetone for 10 min. The teflon chamber was washed with isopropyl alcohol for 10 min. The teflon chamber was washed with deionized water for 10 min. Then, the teflon chamber was blow-dried with a nitrogen gun.

b) 0.3366 g of CsCl, 0.1433 g of AgCl, 0.0442 g of InCl$_3$ and 0.2523 g of BiCl$_3$ were weighed, mixed and placed in the washed teflon chamber. 15 ml of hydrochloric acid (the mass percentage concentration of the hydrochloric acid may be 30%) was added in, and the hydrothermal synthesis reactor was assembled.

c) The hydrothermal synthesis reactor was placed in a muffle furnace. Temperature parameters of the muffle furnace was set such that the temperature was raised from 30° C. to 180° C. for 2 h and held for 10 h. Then, the temperature was slowly lowered to room temperature at a cooling rate of 1° C./h.

d) The hydrothermal synthesis reactor was taken out of the muffle furnace. The hydrochloric acid was poured out of the teflon chamber to obtain crystals. Then, ultrasonic cleaning was performed with ethanol for 5 min to obtain a clean Cs$_2$AgIn$_{0.2}$Bi$_{0.8}$Cl$_6$ crystal.

Embodiment 2

In this embodiment, a method for preparing a perovskite powder is specifically as follows.

a) The teflon chamber was washed with deionized water for 10 min. The teflon chamber was washed with acetone for 10 min. The teflon chamber was washed with isopropyl alcohol for 10 min. The teflon chamber was washed with deionized water for 10 min. Then, the teflon chamber was blow-dried with a nitrogen gun.

b) 0.3366 g of CsCl, 0.1433 g of AgCl, 0.0884 g of InCl$_3$ and 0.1892 g of BiCl$_3$ were weighed, mixed and placed in the washed teflon chamber. 15 ml of hydrochloric acid (the mass percentage concentration of the hydrochloric acid may be 38%) was added in, and the hydrothermal synthesis reactor was assembled.

c) The hydrothermal synthesis reactor was placed in a muffle furnace. Temperature parameters of the muffle furnace was set such that the temperature was raised from 30° C. to 160° C. for 2 h and held for 10 h. Then, the temperature was slowly lowered to room temperature at a cooling rate of 10° C./h.

d) The hydrothermal synthesis reactor was taken out of the muffle furnace. The hydrochloric acid was poured out of the teflon chamber to obtain perovskite powder. Then, ultrasonic cleaning was performed with ethanol for 5 min to obtain a clean Cs$_2$AgIn$_{0.4}$Bi$_{0.6}$Cl$_6$ powder.

Embodiment 3

In this embodiment, a method for preparing a perovskite single crystal is specifically as follows.

a) The teflon chamber was washed with deionized water for 10 min. The teflon chamber was washed with acetone for 10 min. The teflon chamber was washed with isopropyl alcohol for 10 min. The teflon chamber was washed with deionized water for 10 min. Then, the teflon chamber was blow-dried with a nitrogen gun.

b) 0.3366 g of CsCl, 0.1433 g of AgCl, 0.1326 g of InCl$_3$ and 0.1262 g of BiCl$_3$ were weighed, mixed and placed in the washed teflon chamber. 15 ml of hydrochloric acid (the mass percentage concentration of the hydrochloric acid may be 30%) was added in, and the hydrothermal synthesis reactor was assembled.

c) The hydrothermal synthesis reactor was placed in a muffle furnace. Temperature parameters of the muffle furnace was set such that the temperature was raised from 30° C. to 220° C. for 2 h and held for 10 h. Then, the temperature was slowly lowered to room temperature at a cooling rate of 1° C./h.

d) The hydrothermal synthesis reactor was taken out of the muffle furnace. The hydrochloric acid was poured out of the teflon chamber to obtain crystals. Then, ultrasonic cleaning was performed with ethanol for 5 min to obtain a clean Cs$_2$AgIn$_{0.6}$Bi$_{0.4}$Cl$_4$ crystal.

Embodiment 4

In this embodiment, a method for preparing perovskite powder is specifically as follows.

a) The teflon chamber was washed with deionized water for 10 min. The teflon chamber was washed with acetone for 10 min. The teflon chamber was washed with isopropyl alcohol for 10 min. The teflon chamber was washed with deionized water for 10 min. Then, the teflon chamber was blow-dried with a nitrogen gun.

b) 0.3366 g of CsCl, 0.1433 g of AgCl, 0.1768 g of InCl$_3$ and 0.0631 g of BiCl$_3$ were weighed, mixed and placed in the washed teflon chamber. 15 ml of hydrochloric acid (the mass percentage concentration of the hydrochloric acid may be 38%) was added in, and the hydrothermal synthesis reactor was assembled.

c) The hydrothermal synthesis reactor was placed in a muffle furnace. Temperature parameters of the muffle furnace was set such that the temperature was raised from 30° C. to 160° C. for 2 h and held for 5 h. Then, the temperature was naturally lowered to room temperature.

d) The hydrothermal synthesis reactor was taken out of the muffle furnace. The hydrochloric acid was poured out of the teflon chamber to obtain perovskite powder. Then, ultrasonic cleaning was performed with ethanol for 5 min to obtain a clean Cs$_2$AgIn$_{0.8}$Bi$_{0.2}$Cl$_6$ powder.

Embodiment 5

In this embodiment, a method for preparing a perovskite single crystal is specifically as follows.

a) The teflon chamber was washed with deionized water for 10 min. The teflon chamber was washed with acetone for 10 min. The teflon chamber was washed with isopropyl alcohol for 10 min. The teflon chamber was washed with deionized water for 10 min. Then, the teflon chamber was blow-dried with a nitrogen gun.

b) 0.336 6 g of CsCl, 0.0117 g of NaCl, 0.1146 g of AgCl and 0.221 g of InCl$_3$ were weighed, mixed and placed in the washed teflon chamber. 15 ml of hydrochloric acid (the mass percentage concentration of the hydrochloric acid may be 34%) was added in, and the hydrothermal synthesis reactor was assembled.

c) The hydrothermal synthesis reactor was placed in a muffle furnace. Temperature parameters of the muffle furnace was set such that the temperature was raised from 30° C. to 220° C. for 2 h and held for 5 h. Then, the temperature was slowly lowered to room temperature at a cooling rate of 1° C./h.

d) The hydrothermal synthesis reactor was taken out of the muffle furnace. The hydrochloric acid was poured out of the teflon chamber to obtain crystals. Then, ultrasonic cleaning was performed with ethanol for 5 min to obtain a clean $Cs_2Na_{0.2}Ag_{0.8}InCl_6$ crystal.

Embodiment 6

In this embodiment, a method for preparing a perovskite single crystal is specifically as follows.

a) The teflon chamber was washed with deionized water for 10 min. The teflon chamber was washed with acetone for 10 min. The teflon chamber was washed with isopropyl alcohol for 10 min. The teflon chamber was washed with deionized water for 10 min. Then, the teflon chamber was blow-dried with a nitrogen gun.

b) 0.3366 g of CsCl, 0.0234 g of NaCl, 0.086 g of AgCl and 0.221 g of $InCl_3$ were weighed, mixed and placed in the washed teflon chamber. 10 ml of hydrochloric acid was added in, and the hydrothermal synthesis reactor was assembled.

c) The hydrothermal synthesis reactor was placed in a muffle furnace. Temperature parameters of the muffle furnace was set such that the temperature was raised from 30° C. to 180° C. for 2 h and held for 10 h. Then, the temperature was slowly lowered to room temperature at a cooling rate of 2° C./h.

d) The hydrothermal synthesis reactor was taken out of the muffle furnace. The hydrochloric acid was poured out of the teflon chamber to obtain crystals. Then, ultrasonic cleaning was performed with ethanol for 5 min to obtain a clean $Cs_2Na_{0.4}Ag_{0.6}InCl_6$ crystal.

Embodiment 7

In this embodiment, a method for preparing a perovskite single crystal is specifically as follows.

a) The teflon chamber was washed with deionized water for 10 min. The teflon chamber was washed with acetone for 10 min. The teflon chamber was washed with isopropyl alcohol for 10 min. The teflon chamber was washed with deionized water for 10 min. Then, the teflon chamber was blow-dried with a nitrogen gun.

b) 0.3366 g of CsCl, 0.0351 g of NaCl, 0.0573 g of AgCl and 0.221 g of $InCl_3$ were weighed, mixed, and placed in the washed teflon chamber. 15 ml of hydrochloric acid was added in, and the hydrothermal synthesis reactor was assembled.

c) The hydrothermal synthesis reactor was placed in a muffle furnace. Temperature parameters of the muffle furnace was set such that the temperature was raised from 30° C. to 180° C. for 2 h and held for 10 h. Then, the temperature was slowly lowered to room temperature at a cooling rate of 1° C./h.

d) The hydrothermal synthesis reactor was taken out of the muffle furnace. The hydrochloric acid was poured out of the teflon chamber to obtain crystals. Then, ultrasonic cleaning was performed with ethanol for 5 min to obtain a clean $Cs_2Na_{0.6}Ag_{0.4}InCl_6$ crystal.

Embodiment 8

In this embodiment, a method for preparing a perovskite single crystal is specifically as follows.

a) The teflon chamber was washed with deionized water for 10 min. The teflon chamber was washed with acetone for 10 min. The teflon chamber was washed with isopropyl alcohol for 10 min. The teflon chamber was washed with deionized water for 10 min. Then, the teflon chamber was blow-dried with a nitrogen gun.

b) 0.3366 g of CsCl, 0.0468 g of NaCl, 0.0286 g of AgCl and 0.221 g of $InCl_3$ were weighed, mixed, and placed in the washed teflon chamber. 20 ml of hydrochloric acid was added in, and the hydrothermal synthesis reactor was assembled.

c) The hydrothermal synthesis reactor was placed in a muffle furnace. Temperature parameters of the muffle furnace was set such that the temperature was raised from 30° C. to 180° C. for 2 h and held for 10 h. Then, the temperature was slowly lowered to room temperature at a cooling rate of 0.5° C./h.

d) The hydrothermal synthesis reactor was taken out of the muffle furnace. The hydrochloric acid was poured out of the teflon chamber to obtain crystals. Then, ultrasonic cleaning was performed with ethanol for 5 min to obtain a clean $Cs_2Na_{0.8}Ag_{0.2}InCl_6$ crystal.

Embodiment 9

In this embodiment, a method for preparing a perovskite single crystal is specifically as follows.

a) The teflon chamber was washed with deionized water for 10 min. The teflon chamber was washed with acetone for 10 min. The teflon chamber was washed with isopropyl alcohol for 10 min. The teflon chamber was washed with deionized water for 10 min. Then, the teflon chamber was blow-dried with a nitrogen gun.

b) 0.3366 g of CsCl, 0.0468 g of NaCl, 0.0286 g of AgCl, 0.1768 g of $InCl_3$ were weighed, mixed, and placed in the washed teflon chamber. 15 ml of hydrochloric acid was added in, and the hydrothermal synthesis reactor was assembled.

c) The hydrothermal synthesis reactor was placed in a muffle furnace. Temperature parameters of the muffle furnace was set such that the temperature was raised from 30° C. to 180° C. for 2 h and held for 10 h. Then, the temperature was slowly lowered to room temperature at a cooling rate of 1° C./h.

d) The hydrothermal synthesis reactor was taken out of the muffle furnace. The hydrochloric acid was poured out of the teflon chamber to obtain crystals. Then, ultrasonic cleaning was performed with ethanol for 5 min to obtain a clean $Cs_2Na_{0.8}Ag_{0.2}In_{0.8}Bi_{0.2}Cl_6$ crystal.

Embodiment 10

In this embodiment, a method for preparing a perovskite powder is specifically as follows.

a) The teflon chamber was washed with deionized water for 10 min. The teflon chamber was washed with acetone for 10 min. The teflon chamber was washed with isopropyl alcohol for 10 min. The teflon chamber was washed with deionized water for 10 min. Then, the teflon chamber was blow-dried with a nitrogen gun.

b) 0.3366 g of CsCl, 0.0117 g of NaCl, 0.1146 g of AgCl, 0.0442 g of $InCl_3$ and 0.2523 g of $BiCl_3$, were weighed, mixed, and placed in the washed teflon chamber. 5 ml of hydrochloric acid was added in, and the hydrothermal synthesis reactor was assembled.

c) The hydrothermal synthesis reactor was placed in a muffle furnace. Temperature parameters of the muffle furnace was set such that the temperature was raised from 30° C. to 180° C. for 2 h and held for 10 h. Then, the temperature was slowly lowered to room temperature at a cooling rate of 10° C./h.

d) The hydrothermal synthesis reactor was taken out of the muffle furnace. The hydrochloric acid was poured out of the teflon chamber to obtain perovskite powder. Then, ultrasonic cleaning was performed with ethanol for 5 min to obtain a clean $Cs_2Na_{0.2}Ag_{0.8}In_{0.2}Bi_{0.8}Cl_6$ powder.

Embodiment 11

In this embodiment, a method for preparing a rare earth modified phosphor is specifically as follows.

2 mmol of cesium chloride (CsCl), 0.6 mmol of silver chloride (AgCl), 0.4 mmol of sodium chloride (NaCl), 0.98 mmol of indium chloride ($InCl_3$) and 0.02 mmol of europium chloride ($EuCl_3$) were respectively weighed, and all of which have a purity of 99.9% or higher. The weighed raw materials were poured into a 25 ml hydrothermal synthesis reactor, and 10 ml of hydrochloric acid was subsequently added in. The hydrothermal synthesis reactor was placed in a muffle furnace to be held at 180° C. for 12 hours and then cooled to room temperature at a rate of 6° C./h. After being cooled to room temperature, solid substances were taken out of the hydrothermal synthesis reactor and washed 3 times with ethanol. The washed solid substances were placed in an oven to be baked at 80° C. for 10 hours until they are completely dried. The dried solid substances were grinded in an agate mortar.

The rare earth ion doped perovskite phosphor $Cs_2Ag_{0.6}Na_{0.4}In_{0.98}Eu_{0.22}Cl_6$ prepared in this embodiment has an emission wavelength of 410 nm to 750 mu under excitation of 350 nm ultraviolet light, and the emission dominant wavelength is 555 nm. This phosphor can be excited by ultraviolet light of 270 nm to 400 nm, and is a novel phosphor for white LEDs suitable for excitation by ultraviolet LED chips.

Embodiment 12

In this embodiment, a method for preparing a rare earth modified phosphor is specifically as follows.

2 mmol of cesium chloride (CsCl), 0.6 mmol of silver chloride (AgCl), 0.4 mmol of sodium chloride (NaCl), 0.8 mmol of indium chloride ($InCl_3$) and 0.2 mmol of holmium chloride ($HoCl_3$) was respectively weighed. The weighed raw materials were poured into a 25 ml hydrothermal synthesis reactor, and 4 ml of hydrochloric acid was subsequently added in. The hydrothermal synthesis reactor was placed in a muffle furnace to be held at 180° C. for 12 hours and then cooled to room temperature at a rate of 5° C./h. After being cooled to room temperature, solid substances were taken out of the hydrothermal synthesis reactor and washed 5 times with ethanol. The washed solid substances were placed in an oven to be baked at 90° C. for 10 hours until they are completely dried. The dried solid substances were grinded in an agate mortar.

The rare earth ion doped perovskite phosphor $Cs_2Ag_{0.6}Na_{0.4}In_{0.8}Ho_{0.2}Cl_6$ prepared in this embodiment has an emission wavelength of 400 nm to 750 nm under excitation of 370 nm ultraviolet light, and the emission dominant wavelength is 555 nm. This phosphor can be excited by ultraviolet light of 290 nm to 400 nm, and is a novel phosphor for white LEDs suitable for excitation by ultraviolet LED chips.

Embodiment 13

In this embodiment, a method for preparing a perovskite film with high fluorescence yield is specifically as follows.

a) CsCl, NaCl, AgCl, $InCl_3$ and $BiCl_3$ powders were placed into evaporation boats in a vacuum chamber. A substrate to be deposited was placed in the vacuum chamber and vacuuming is started.

b) After the vacuum degree is reduced to $5\times10^{-4}$ Pa, the CsCl, AgCl, NaCl, $InCl_3$ and $BiCl_3$ powders were evaporated in sequence at a rate of 1 Å/s or less to deposit a CsCl film with a thickness of 50 nm, a AgCl film with a thickness of 10.09 nm, a NaCl film with a thickness of 5.425 nm, a $InCl_3$ film with a thickness of 32.76 nm and a $BiCl_3$ film with a thickness of 0.3 nm.

c) The substrate was taken out, annealed at 150° C. for 30 min in a glove box, exposed to the moisture in the air for 10 min, and then annealed at 200° C. for 20 min in the glove box to obtain a multi-element perovskite film with high fluorescence yield.

Embodiment 14

In this embodiment, a method for preparing a perovskite film with high fluorescence yield is specifically as follows:

a) CsCl, NaCl, AgCl, $InCl_3$ and $BiCl_3$ powders were placed into evaporation boats in a vacuum chamber. A substrate to be deposited was placed in the vacuum chamber, and vacuuming was started.

b) After the vacuum degree is reduced to $5\times10^{-4}$ Pa, the CsCl, $InCl_3$, $BiCl_3$, NaCl and AgCl powders were evaporated in sequence at a rate of 1 Å/s or less to deposit a CsCl film with a thickness of 30 nm, a $InCl_3$ film with a thickness of 19.657 nm, a $BiCl_3$ film with a thickness of 0.2 nm, a NaCl film with a thickness of 3.255 nm, and a AgCl film with a thickness of 6.055 nm.

c) The substrate was taken out, annealed at 180° C. for 20 min in a glove box, exposed to the moisture in the air for 5 min, and then annealed at 150° C. for 20 min in the glove box to obtain a multi-element perovskite film with high fluorescence yield.

Embodiment 15

In this embodiment, a method for preparing a white-light electroluminescent device is specifically as follows.

a) A 1.7 cm×1.7 cm indium tin oxide (ITO) substrate was washed with deionized water for 20 min. The indium tin oxide (ITO) substrate was washed with acetone for 20 min. The indium tin oxide (ITO) substrate was washed with isopropyl alcohol for 20 min. The indium tin oxide (ITO) substrate was washed with deionized water for 20 min. The indium tin oxide (ITO) substrate was blow-dried with a nitrogen gun.

b) Zinc oxide (ZnO) nanoparticles was spin-coated as a first transmission layer.

(1) 3 mmol of zinc acetate dehydrate was dissolved in 30 ml of dimethyl sulfoxide (DMSO). 5.5 mmol of tetramethylammonium hydroxide (TMAH) was dissolved in 10 ml of ethanol. The ethanol solution was dropwise added to the above DMSO solution after TMAH is completely dissolved. The obtained solution is heated in a water bath at 30° C. for 1 h.

(2) The solution (40 ml in total) obtained in the step (1) was allocated into four centrifuge tubes, and 10 ml for each centrifuge tube. A first purification is performed for the solution in each centrifuge tube. 10 ml of ethyl acetate was added to 10 ml of the solution to form precipitation. Centrifugation is performed at 3000 rpm for 3 min. After centrifugation, the supernatant was removed and then 2 ml of ethanol was added to dissolve the precipitation, while 60 µl of ethanolamine was added in as a stabilizer.

(3) The above ethanol solution was transferred to a transparent centrifuge tube, and then a second purification was performed. Firstly, 0.5 ml of ethyl acetate was added to the solution each time. If the solution becomes turbid, the addition of ethyl acetate was stopped, and the centrifuge tube was shaken to make the solution gradually clear. Then, 0.1 ml of ethyl acetate was added to the solution each time, until the solution becomes completely turbid. Centrifugation was performed at 3000 rpm for 3 min. Finally, the supernatant was removed and 1 ml of ethanol was added in to dissolve the precipitation, thereby a ZnO ethanol solution was obtained with a concentration of 25 mg/ml.

(4) After the above solution was filtered for three times, spin coating was performed on a clean indium tin oxide (ITO) substrate at a rotation speed of 3000 rpm for 60 s. Then, annealing was performed on a hot stage at 120° C. for 10 min, thereby obtaining a ZnO thin film with a thickness of about 20 nm.

c) Polyaziridine was spin-coated as an interface layer.

(1) 1 mg of epoxidized polyaziridine (PEIE) was weighed and placed in a clean glass bottle. 1 g of isopropyl alcohol was added in and stirred at room temperature for 10 hours to sufficiently dissolve the PEIE;

(2) After filtering the above isopropyl alcohol solution three times, PEIE was spin-coated on the ITO substrate, spin-coated by ZnO, at a rotation speed of 5000 rpm for 60 s.

d) An active layer was prepared by using the method in Embodiment 14.

c) A second transmission layer was deposited.

The above substrate was placed in the vapor deposition apparatus again. A TAPC (N, N-di-4-methylphenylaniline) film with a thickness of 20 nm was deposited when the vacuum degree reaches $1.0 \times 10^{-4}$ Pa, the deposition rate is controlled to be 0.05 Å/s.

f) An electrode/composite electrode layer was deposited.

(1) The above prepared film was transferred to a vapor deposition apparatus, and vacuuming was started. Deposition process was performed when the vacuum degree reaches $1.5 \times 10^{-4}$ Pa.

(2) Firstly, a molybdenum oxide ($MoO_3$) film was deposited with a thickness of 6 nm at a rate of 0.02 Å/s. Finally, an aluminum (Al) electrode layer was deposited with a thickness of 100 nm at a rate of 3.00 Å/s to complete the preparation of the white-light electroluminescent device.

Embodiment 16

In this embodiment, a method for preparing a white-light electroluminescent device is specifically as follows.

a) A 1.7 cm×1.7 cm indium tin oxide (ITO) substrate was washed with deionized water for 15 min. The indium tin oxide (ITO) substrate was washed with acetone for 15 min. The indium tin oxide (ITO) substrate was washed with isopropyl alcohol for 15 min. The indium tin oxide (ITO) substrate was washed with deionized water for 15 min. The indium tin oxide (ITO) substrate was blow-dried with a nitrogen gun.

b) Zinc oxide (ZnO) nanoparticles was spin-coated as a first transmission layer.

(1) 3 mmol of zinc acetate dehydrate was dissolved in 30 ml of dimethyl sulfoxide (DMSO). 5.5 mmol of tetramethylammonium hydroxide (TMAH) was dissolved in 10 ml of ethanol. The ethanol solution was dropwise added to the above DMSO solution after TMAH is completely dissolved. The obtained solution is heated in a water bath at 30° C. for 1 h.

(2) The solution (40 ml in total) obtained in the step (1) was allocated into four centrifuge tubes, and 10 ml for each centrifuge tube. A first purification is performed for the solution in each centrifuge tube. 10 ml of ethyl acetate was added to 10 ml of the solution to form precipitation. Centrifugation is performed at 3000 rpm for 5 min After centrifugation, the supernatant was removed and then 2 ml of ethanol was added to dissolve the precipitation, while 60 µl of ethanolamine was added in as a stabilizer.

(3) The above ethanol solution was transferred to a transparent centrifuge tube, and then a second purification was performed. Firstly, 0.5 ml of ethyl acetate was added to the solution each time. If the solution becomes turbid, the addition of ethyl acetate was stopped, and the centrifuge tube was shaken to make the solution gradually clear. Then, 0.1 ml of ethyl acetate was added to the solution each time, until the solution becomes completely turbid. Centrifugation was performed at 3000 rpm for 5 min. Finally, the supernatant was removed and 1 ml of ethanol was added in to dissolve the precipitation, thereby a ZnO ethanol solution was obtained with a concentration of 30 mg/ml.

(4) After the above solution was filtered for three times, spin coating was performed on a clean indium tin oxide (ITO) substrate at a rotation speed of 3000 rpm for 60 s. Then, annealing was performed on a hot stage at 120° C. for 10 min, thereby obtaining a ZnO thin film with a thickness of about 20 nm.

c) An active layer was prepared by using the method in Embodiment 13;

d) A second transmission layer was deposited.

The above substrate was placed in the vapor deposition apparatus again. A TAPC (N, N-di-4-methylphenylaniline) film with a thickness of 20 nm was deposited when the vacuum degree reaches $1.0 \times 10^{-4}$ Pa, the deposition rate is controlled to be 0.03 Å/s.

e) An electrode/composite electrode layer was deposited.

(1) The above prepared film was transferred to a vapor deposition apparatus, and vacuuming was started. Deposition process was performed when the vacuum degree reaches $1.5 \times 10^{-4}$ Pa.

(2) Firstly, a molybdenum oxide ($MoO_3$) film was deposited with a thickness of 5 nm at a rate of 0.02 Å/s. Finally, an aluminum (Al) electrode layer was deposited with a thickness of 80 nm at a rate of 2.80 Å/s to complete the preparation of the white-light electroluminescent device.

Embodiment 17

In this embodiment, a method for preparing a white-light electroluminescent device is specifically as follows.

a) A 1.7 cm×1.7 cm indium tin oxide (ITO) substrate was washed with deionized water for 18 min. The indium tin oxide (ITO) substrate was washed with acetone for 18 min. The indium tin oxide (ITO) substrate was washed with isopropyl alcohol for 18 min. The indium tin oxide (ITO) substrate was washed with deionized water for 18 min. The indium tin oxide (ITO) substrate was blow-dried with a nitrogen gun.

b) A poly(3,4-ethylenedioxythiophene) polystyrene sulfonate (PEDOT:PSS) layer was spin coated.

(1) The above cleaned ITO substrate was subjected to ozone plasma treatment for 10 min to increase its hydrophilicity.

(2) The PEDOT:PSS aqueous solution was spin coated on the clean indium tin oxide (ITO) substrate at a rotation speed of 5000 rpm for 60 s, and then annealing was performed on a hot stage at 150° C. for 10 min to obtain a PEDOT:PSS thin film with a thickness of about 20 nm.

c) An active layer was deposited by using the method in Embodiment 13.

d) A second transmission layer was deposited.

The above substrate was placed in the vapor deposition apparatus again. A TPBI (1,3,5-tris(1-phenyl-1H-benzimidazol-2-yl)benzene) film was deposited with a thickness of 30 nm when the vacuum degree reaches $1.5\times10^{-4}$ Pa, and the deposition rate was controlled to be 0.02 to 0.05 Å/s;

e) An electrode/composite electrode layer was deposited.

(1) The above prepared film was transferred to a vapor deposition apparatus, and vacuuming was started. Deposition process was performed when the vacuum degree reaches $1.5\times10^{-4}$ Pa.

(2) Firstly, a molybdenum oxide ($MoO_3$) film was deposited with a thickness of 1 mm at a rate of 0.01 Å/s. Finally, an aluminum (Al) electrode layer was deposited with a thickness of 80 nm at a rate of 3.00 Å/s to complete the preparation of the white-light electroluminescent device.

Embodiment 18

In this embodiment, a method for preparing a white-light electroluminescent device is specifically as follows.

a) A 1.7 cm×1.7 cm indium tin oxide (ITO) substrate was washed with deionized water for 20 min. The indium tin oxide (ITO) substrate was washed with acetone for 20 min. The indium tin oxide (ITO) substrate was washed with isopropyl alcohol for 20 min. The indium tin oxide (ITO) substrate was washed with deionized water for 20 min. The indium tin oxide (ITO) substrate was blow-dried with a nitrogen gun.

b) Zinc oxide (ZnO) nanoparticles was spin coated as a first transmission layer.

(1) 3 mmol of zinc acetate dehydrate was dissolved in 30 ml of dimethyl sulfoxide (DMSO). 5.5 mmol of tetramethylammonium hydroxide (TMAH) was dissolved in 10 ml of ethanol. The ethanol solution was dropwise added to the above DMSO solution after TMAH is completely dissolved. The obtained solution is heated in a water bath at 30° C. forth.

(2) The solution (40 ml in total) obtained in the step (1) was allocated into four centrifuge tubes, and 10 ml for each centrifuge tube. A first purification is performed for the solution in each centrifuge tube. 10 ml of ethyl acetate was added to 10 ml of the solution to form precipitation. Centrifugation is performed at 3000 rpm for 5 min. After centrifugation, the supernatant was removed and then 2 ml of ethanol was added to dissolve the precipitation, while 60 μl of ethanolamine was added in as a stabilizer.

(3) The above ethanol solution was transferred to a transparent centrifuge tube, and then a second purification was performed. Firstly, 0.5 ml of ethyl acetate was added to the solution each time. If the solution becomes turbid, the addition of ethyl acetate was stopped, and the centrifuge tube was shaken to make the solution gradually clear. Then, 0.1 ml of ethyl acetate was added to the solution each time, until the solution becomes completely turbid. Centrifugation was performed at 3000 rpm for 5 min. Finally, the supernatant was removed and 1 ml of ethanol was added in to dissolve the precipitation, thereby a ZnO ethanol solution was obtained with a concentration of 25 mg/ml.

(4) After the above solution was filtered for three times, spin coating was performed on a clean indium tin oxide (ITO) substrate at a rotation speed of 3000 rpm for 60 s. Then, annealing was performed on a hot stage at 120° C. for 10 min, thereby obtaining a ZnO thin film with a thickness of about 20 nm.

c) An active layer was deposited by using the method in Embodiment 14.

d) A second transmission layer was deposited.

The above substrate was placed in the vapor deposition apparatus again. A TAPC (N, N-di-4-methylphenylaniline) film with a thickness of 30 nm was deposited when the vacuum degree reaches $1.0\times10^{-4}$ Pa, the deposition rate is controlled to be 0.05 Å/s.

e) An electrode/composite electrode layer was deposited.

(1) The above prepared film was transferred to a vapor deposition apparatus, and vacuuming was started. Deposition process was performed when the vacuum degree reaches $1.5\times10^{-4}$ Pa.

(2) Firstly, a molybdenum oxide ($MoO_3$) film was deposited with a thickness of 5 nm at a rate of 0.02 Å/s. Finally, an aluminum (Al) electrode layer was deposited with a thickness of 80 nm at a rate of 3.50 Å/s to complete the preparation of the white-light electroluminescent device.

It should be readily understood to those skilled in the art that the above description is only preferred embodiments of the present invention, and does not limit the scope of the present invention. Any change, equivalent substitution and modification made without departing from the spirit and scope of the present invention should be included within the scope of the protection of the present invention.

What is claimed is:

1. A method for preparing a multi-element perovskite material having a chemical formula of $Cs_2Na_xAg_{1-x}In_yBi_{1-y}Cl_6$, wherein $0\leq x\leq 1$, $0\leq y\leq 1$, and x and y are not simultaneously equal to 0 or 1, the method comprising:
respectively weighing powders of CsCl, NaCl, AgCl, $InCl_3$, and $BiCl_3$ according to a stoichiometric ratio of the chemical formula $Cs_2Na_xAg_{1-x}In_yBi_{1-y}Cl_6$, wherein $0\leq x\leq 1$, $0\leq y\leq 1$, and x and y are not simultaneously equal to 0 or 1;
mixing the powders of CsCl, NaCl, AgCl, $InCl_3$, and $BiCl_3$ to form a powder mixture;
mixing the powder mixture with concentrated hydrochloric acid having a mass percentage concentration of 30% to 38% to obtain a precursor mixture having a concentration of 0.5 M to 2 M;
subjecting the precursor mixture to hydrothermal reaction at 160° C. to 220° C. for 5 to 10 hours; and
cooling the precursor mixture to room temperature to obtain the multi-element perovskite material $Cs_2Na_xAg_{1-x}In_yBi_{1-y}Cl_6$ in power form when the cooling rate is greater than 10° C./h or in crystal form when the cooling rate is less than 3° C./h.

2. A single-phase phosphor with broadband emission having a chemical formula of $Cs_2Na_xAg_{1-x}In_yBi_zLn_{1-y-z}Cl_6$, wherein Ln represents a rare earth element, $0.2\leq x\leq 0.8$, $0.8\leq y<1$, $0\leq z<0.2$, and $y+z<1$.

3. The broadband single-phase phosphor of claim 2, the rare earth element is Ho or Eu.

4. A method for preparing a film with high fluorescence yield and composed of a multi-element perovskite material having a chemical formula of $Cs_2Na_xAg_{1-x}In_yBi_{1-y}Cl_6$, wherein $0\leq x\leq 1$, $0\leq y\leq 1$, and x and y are not simultaneously equal to 0 or 1, the method comprising:
respectively evaporating raw materials of CsCl, NaCl, AgCl, $InCl_3$, and $BiCl_3$ according to the stoichiometric ratio of $Cs_2Na_xAg_{1-x}In_yBi_{1-y}Cl_6$ (0.2≤x≤0.8, 0.8≤y≤1) under vacuum at a deposition rate of 1 Å/s or less to form a multi-layered thin film on a substrate;

heating the multi-layered thin film at 100° C. to 200° C. for a period of time;

exposing the multi-layered thin film to moisture in the air for 5 to 15 minutes; and heating the multi-layered thin film at 100° C. to 200° C. for a period of time to obtain a perovskite film with high fluorescence yield.

5. The method of claim 4, wherein the evaporating step is performed in an order that NaCl and AgCl are successively evaporated, and BiCl3 and InCl3 are successively evaporated.

* * * * *